(12) United States Patent
Nishimura et al.

(10) Patent No.: US 7,809,285 B2
(45) Date of Patent: Oct. 5, 2010

(54) RECEIVING CIRCUIT AND OPTICAL SIGNAL RECEIVING CIRCUIT

(75) Inventors: Kazuko Nishimura, Kyoto (JP); Hiroshi Kimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 785 days.

(21) Appl. No.: 11/662,090

(22) PCT Filed: Aug. 29, 2005

(86) PCT No.: PCT/JP2005/015638

§ 371 (c)(1),
(2), (4) Date: Mar. 7, 2007

(87) PCT Pub. No.: WO2006/027965

PCT Pub. Date: Mar. 16, 2006

(65) Prior Publication Data

US 2008/0056732 A1   Mar. 6, 2008

(30) Foreign Application Priority Data

Sep. 7, 2004  (JP) ............................. 2004-259380

(51) Int. Cl.
    H04B 10/06 (2006.01)
(52) U.S. Cl. ........................................ 398/209; 398/202
(58) Field of Classification Search ............ 398/202, 398/209
    See application file for complete search history.

(56) References Cited

U.S. PATENT DOCUMENTS

| 6,246,282 B1 | 6/2001 | Oono et al. |
| 2003/0123168 A1 | 7/2003 | Yokomizo |

FOREIGN PATENT DOCUMENTS

| JP | 10-284955 | 10/1998 |
| JP | 2000-151290 A | 5/2000 |
| JP | 2000-315923 A | 11/2000 |
| JP | 2001-211040 A | 8/2001 |
| JP | 2003-198296 | 7/2003 |
| JP | 2004-7706 A | 1/2004 |

OTHER PUBLICATIONS

Japanese Notice of Reasons for Rejection, w/ English translation thereof, issued in Japanese Patent Application No. JP 2006-535118 dated Apr. 13, 2010.

*Primary Examiner*—Leslie Pascal
(74) *Attorney, Agent, or Firm*—McDermott Will & Emery LLP

(57) ABSTRACT

A receiving circuit comprises a transimpedance amplifier 3 including an inversion amplifier 2 for amplifying an input current IN, and a feedback resistance R1 connected between an input and an output of the inversion amplifier 2, a comparison circuit 4 for comparing an output OUT of the transimpedance amplifier 3 with a certain desired reference value, and outputting a result of the comparison, and a control circuit for holding the comparison result, and generating an AGC signal 20 for adjusting a gain of the transimpedance amplifier 3. The transimpedance amplifier 20 has a function capable of gain adjustment in accordance with the input AGC signal 20. The control circuit 5 performs gain adjustment until the output OUT of the transimpedance amplifier 3 exceeds the reference value so that an appropriate gain is obtained. Therefore, even when an input has a wide dynamic range, it is possible to prevent signal saturation and a distortion in output waveform in the transimpedance amplifier, so that appropriate reception can be invariably performed and a signal having a stable duty can be output.

8 Claims, 22 Drawing Sheets

RECEIVING CIRCUIT AND OPTICAL SIGNAL RECEIVING CIRCUIT

RELATED APPLICATIONS

This application is the U.S. National Phase under 35 U.S.C. §371 of International Application No. PCT/JP2005/015638 filed on Aug. 29, 2005, which in turn claims the benefit of Japanese Application No. 2004-259380, filed on Sep. 7, 2004, the disclosures of which Applications are incorporated by reference herein.

TECHNICAL FIELD

The present invention relates to a receiving circuit and a light receiving circuit which achieve a wide dynamic range.

BACKGROUND ART

In recent years, as information and communication technologies progress, there is a demand for higher-speed optical transmission, a larger transmission capacity, and a longer transmission distance, which require a considerably advanced transmission technique. A form of such an optical transmission technique is a PON (Passive Optical Network) system. In the PON system, one station and a plurality of subscribers are connected by time-division multiplexing. In upward transmission from each subscriber to the station, the transmission distance from each subscriber to the station varies from subscriber to subscriber, resulting in a significant difference in received power. Particularly, at present, high speed and long distances are required, so that the width of a power level between burst signals is being further increased. In such a situation, for light receiving circuits, it is essentially necessary to output a signal having a stable duty so that a signal can be appropriately received irrespective of the magnitude of the signal and data is reproduced with high precision in a subsequent amplifier circuit or clock recovery circuit.

However, in conventional light receiving circuits, when a large optical signal is input, the output of a transimpedance amplifier is saturated, so that a distortion occurs in a waveform. Also, in worst cases, the output is fixed to an H level or an L level, so that a waveform is not output.

A conventional light receiving circuit used to address this problem is illustrated in FIG. 2.

In the light receiving circuit of FIG. 2, an electrical signal IN100 which is a current obtained by photoelectric conversion of an input optical input signal by a light receiving element 100 is input to an inversion amplifier 101. A feedback resistance R100 is connected in parallel between the input and output of the inversion amplifier 101 to configure a transimpedance amplifier. Further, a series connection of a feedback resistance R101 and a diode RC, a series connection of a feedback resistance R102a and a transistor M100a, and a series connection of a feedback resistance R103a and a transistor M100b are connected in parallel to the feedback resistance R100 of the transimpedance amplifier.

The output of the transimpedance amplifier is input to comparators 102a and 102b, and is compared with comparative values set in the comparators 102a and 102b. These comparative values are a comparative value VB100a in the comparator 102a and a comparative value VB100b in the comparator 102b.

The comparison results of the comparators 102a and 102b are input to clock input terminals C of flip-flops 103a and 103b whose data input terminals D are connected to a VDD voltage. A signal 100a and a signal 100b which are output from output terminals Q of the flip-flops 103a and 103b are input to the gates of the transistors M100a and M100b, respectively.

With the configuration, when the output values of the comparators 102a and 102b go to the high level, i.e., when an optical input signal has a large level, so that the output value of the transimpedance amplifier is lower than the comparative value VB100a or VB100b set in the comparator 102a or 102b, the comparison results output from the comparators 102a and 102b go to the high level, and a high-level signal is output of the output terminal Q of the flip-flop 103a or 103b which receives the high-level signal at the clock input terminal C.

Thereby, the transistor M100a or M100b is switched ON, so that a value when the feedback resistance R100 and R102a or R102b are connected in parallel to the transimpedance amplifier is fed back to the transimpedance amplifier, and therefore, the amplification factor is suppressed so that the value of the output OUT100 is suppressed to an appropriate value.

The light receiving circuit is described in Patent Document 1. Conventionally, the magnitudes of the feedback resistances are switched in a manner as described above, so that when a large optical signal is input, the feedback resistance is set to be small so that the gain of the transimpedance amplifier is reduced, thereby preventing saturation.

Examples of a means for generating a control signal, depending on the output of the transimpedance amplifier includes: (1) a means for generating a control signal using a feedback-type automatic gain control (AGC) function implemented using an analog circuit; (2) a means for determining the amplitude of the output of the transimpedance amplifier using several comparison circuits as illustrated in FIG. 2, and using the result, generating a control signal using; and (3) a method of determining the amplitude of the output of the transimpedance amplifier using a number of comparison circuits, and using the result, generating a control signal.

Patent Document 1: Japanese Patent Unexamined Publication No. 2000-315923 (FIG. 1).

DISCLOSURE OF THE INVENTION

Problems to be Solved by the Invention

However, in the case of the means for generating a control signal (1), a high-speed response is not possible due to a loop time constant. In the means (2), a large step occurs in the amplitude of the output of the transimpedance amplifier in the transition of the gain of the transimpedance amplifier, so that data may be lost during reproduction of data in a subsequent amplifier circuit or clock recovery circuit, resulting in a deterioration in data quality. Also, in the case of the means (3) in which the number of comparison circuits is increased for the purpose of avoiding the problem with (2), a large number of comparison circuits causes a load on the output line of the transimpedance amplifier, so that a normal operation is not possible during, particularly, a high-speed operation.

Further, in the case of the means (2) and (3), when the extinction ratio of an input signal is small, the amount of current at the L level is relatively large. Therefore, when the current amount is set by performing determination once, determination is not accurately performed with respect to a normal level (H level), so that the H level is may be erroneously determined to be the L level, and the AGC function does not work appropriately.

The above-described problem is not limited to input signals which are optical inputs, and similarly arises with respect to electrical signal inputs.

The present invention is provided to solve the problem. An object of the present invention is to suppress a step which otherwise occurs in the amplitude of the output of a transimpedance amplifier with switching the gain thereof, and accurately perform a high-speed operation even when an input signal is changed within a wide dynamic range.

Solution to the Problems

To achieve the object, the receiving circuit and the light receiving circuit of the present invention are provided in which a large number of comparison circuits for determining the output level of a transimpedance amplifier are not used, and the number of such comparison circuits are limited to one or two, and a large number of determination levels are provided in a control circuit which is provided subsequent to the comparison circuit, so as to generate a control signal for adjusting the gain of the transimpedance amplifier, thereby reducing the output load of the transimpedance amplifier, resulting in a high-speed operation.

Thereby, a high-speed operation and prevention of occurrence of a large step in an output amplitude can be simultaneously achieved.

Specifically, the receiving circuit of the present invention comprises a transimpedance amplifier including an inversion amplifier for amplifying an input current and a feedback resistance connected in parallel between an input and an output of the inversion amplifier (a gain of the transimpedance amplifier is adjusted in accordance with a control signal), a comparison circuit for comparing an output value of the transimpedance amplifier with a first comparative value set for determining an output level of the transimpedance amplifier, and outputting a result of the comparison, and a control circuit for holding the comparison result output from the comparison circuit, generating the control signal based on the held comparison result, and transmitting the generated control signal to the transimpedance amplifier. The control circuit includes a plurality of latch circuits for holding the comparison result output from the comparison circuit, and a control signal generating circuit for generating the control signal for adjusting the gain of the transimpedance amplifier based on output results of the plurality of latch circuits, and transmitting the control signal to the transimpedance amplifier. Each of the latch circuits goes to a non-operating state when receiving a held-value resetting signal, and successively goes to an operating state in which the comparison result output from the comparison circuit is held when the held-value resetting signal is successively disabled. The control circuit outputs the control signal so as to adjust the gain of the transimpedance amplifier until the output of the transimpedance amplifier exceeds the first comparative value.

A receiving circuit comprises a transimpedance amplifier including an inversion amplifier for amplifying an input current, and a feedback resistance connected in parallel between an input and an output of the inversion amplifier, wherein a gain of the transimpedance amplifier is adjusted in accordance with a control signal, a comparison circuit for comparing an output value of the transimpedance amplifier with a first comparative value set for determining an output level of the transimpedance amplifier, and outputting a result of the comparison, and a control circuit for holding the comparison result output from the comparison circuit, generating the control signal based on the held comparison result, and transmitting the generated control signal to the transimpedance amplifier. The control circuit includes a plurality of latch circuits for holding the comparison result output from the comparison circuit, a control signal generating circuit for generating the control signal for adjusting the gain of the transimpedance amplifier based on output results of the plurality of latch circuits, and transmitting the control signal to the transimpedance amplifier, and a reset signal generating circuit for generating, based on the reset signal, the held-value resetting signal which is transmitted to the plurality of latch circuits to cause the latch circuits to go to a non-operating state, and which is successively caused not to be transmitted to the latch circuits so that the latch circuits are successively caused to go to an operating state in which the comparison result output from the comparison circuit is held. The control circuit outputs the control signal so as to adjust the gain of the transimpedance amplifier until the output of the transimpedance amplifier exceeds the first comparative value.

A receiving circuit comprises a transimpedance amplifier including an inversion amplifier for amplifying an input current, and a feedback resistance connected in parallel between an input and an output of the inversion amplifier, wherein a gain of the transimpedance amplifier is adjusted in accordance with a control signal, a comparison circuit for comparing an output value of the transimpedance amplifier with a first comparative value set for determining an output level of the transimpedance amplifier, and outputting a result of the comparison, and a control circuit for holding the comparison result output from the comparison circuit, generating the control signal based on the held comparison result, and transmitting the generated control signal to the transimpedance amplifier. The control circuit includes a plurality of latch circuits for holding the comparison result output from the comparison circuit, and a control signal generating circuit for generating the control signal for adjusting the gain of the transimpedance amplifier and a held-value resetting signal to be input to the plurality of latch circuits based on output results of the plurality of latch circuits and the reset signal. Each of the plurality of latch circuits, when receiving the held-value resetting signal generated by the control signal generating circuit, goes to a non-operating state, and when transmission to the latch circuit is successively disabled, goes to an operating state in which the comparison result output from the comparison circuit is successively held. The control circuit outputs the control signal so as to adjust the gain of the transimpedance amplifier until the output of the transimpedance amplifier exceeds the first comparative value.

In the receiving circuit of the present invention, the transimpedance includes an inversion amplifier having a gain adjusting function.

In the receiving circuit of the present invention, the transimpedance amplifier includes one or a plurality of MOS transistors in parallel to the inversion amplifier, and the gain of the transimpedance amplifier is adjusted by switching ON or OFF the MOS transistor.

In the receiving circuit of the present invention, the transimpedance amplifier includes one or a plurality of series circuits each including a feedback resistance and a switch for gain adjustment, in parallel to the inversion amplifier, and the gain of the transimpedance amplifier is adjusted by switching the switch.

In the receiving circuit of the present invention, the control signal generating circuit generates the control signal for adjusting the gain of the transimpedance amplifier based on the comparison results output by the plurality of latch circuits, and when the output of the transimpedance amplifier exceeds the first comparative value, transmits a stop signal to the reset signal generating circuit to hold a state at that time, and does not generate a new signal.

In the receiving circuit of the present invention, the control signal generating circuit generates the control signal for adjusting the gain of the transimpedance amplifier based on the comparison results output by the plurality of latch circuits, and when the output of the transimpedance amplifier exceeds the first comparative value, transmits a stop signal to the plurality of latch circuits to hold a state at that time, and does not perform a new latch operation.

A receiving circuit of the present invention comprises the above-described receiving circuit, and in addition, a reference value generating circuit for receiving the output value of the transimpedance amplifier included in the receiving circuit, and generating an intermediate value of the output value, and a differential amplification circuit for generating a differential signal from the output value of the transimpedance amplifier and an output value of the reference value generating circuit. When the reset signal is input to the reference value generating circuit, the intermediate value is initialized.

In the receiving circuit of the present invention, the reference value generating circuit comprises two or more intermediate value generating circuits connected in parallel, and a switch inserted in series between each of the intermediate value generating circuits and the differential amplification circuit, for selectively connecting the intermediate value generating circuit and the differential amplification circuit. When the switch connected in series receives a signal for switching ON the switch, an intermediate value reset signal for releasing the reset of the intermediate value is input to the intermediate value generating circuit, and when the switch connected in series receives a signal for switching OFF the switch, the intermediate value reset signal for resetting the intermediate value generating circuit is input.

In the receiving circuit of the present invention, the control circuit comprises a plurality of latch circuits for holding the comparison result output from the comparison circuit. The control circuit transmits a held-value resetting signal to the plurality of latch circuits to cause each of the latch circuits to go to a non-operating state, and successively disables the held-value resetting signal of the latch circuits to cause the latch circuits to go to an operating state in which the comparison result output from the comparison circuit is successively held, and based on output values of the plurality of latch circuits, generates the intermediate value reset signal to be input to the intermediate value generating circuit, and a signal for switching ON or OFF the switch for selectively connecting the intermediate value generating circuit to the differential amplification circuit.

In the receiving circuit of the present invention, the control circuit successively disables the held-value resetting signal transmitted to each of the latch circuits, outputs the control signal for controlling the gain of the transimpedance amplifier, and generates the intermediate value reset signal and the signal for switching ON or OFF the switch to switch and select the intermediate value, based on the reset signal and the output values of the plurality of latch circuits, until the output value of the transimpedance amplifier exceeds the first comparative value, and when the output value of the transimpedance amplifier exceeds the first comparative value, does not newly disable the held-value resetting signal.

In the receiving circuit of the present invention, the control circuit comprises a shift register circuit for successively holding the comparison result output from the comparison circuit. The control circuit transmits the reset signal to the shift register circuit to cause the shift register circuit to go to a non-operating state, and disables the reset signal of the shift register circuit to cause the shift register circuit to go to an operating state in which the comparison result output from the comparison circuit is successively held, and based on the reset signal input to the control circuit and an output value of the register circuit, outputs the control signal for adjusting the gain of the transimpedance amplifier, and generates the intermediate value reset signal to be input to the intermediate value generating circuit and a signal for switching ON or OFF the switch for selectively connecting the intermediate value generating circuit to the differential amplification circuit.

In the receiving circuit of the present invention, the two or more intermediate value generating circuits are alternately used.

A receiving circuit of the present invention comprises the above-described receiving circuit, and in addition, a light receiving element for subjecting a received optical input signal to photoelectric conversion to input an electrical signal of current to the inversion amplifier of the receiving circuit.

In the receiving circuit of the present invention, the input signal input to the receiving circuit is a burst signal.

In the light receiving circuit of the present invention, the input signal input to the light receiving circuit is a burst signal.

Thus, in the present invention, the single comparison circuit is used to compare the output value of the transimpedance amplifier, and based on the result, the control circuit generates a control signal for gain adjustment, thereby making it possible to reduce the output load of the transimpedance amplifier, resulting in a high-speed operation.

Further, in the present invention, the output value of the transimpedance amplifier is compared with first and second comparative values (an upper limit value and a lower limit value) by two comparison circuits so as to obtain an output value which falls within an appropriate range. The control circuit generates a control signal so as to adjust the gain into the appropriate range. By limiting the number of comparison circuits to two, the output load is reduced, thereby making it possible to achieve a high-speed operation and more appropriate gain adjustment.

Effect of the Invention

As described above, according to the present invention, only one comparison circuit is connected to the output portion of the transimpedance amplifier, so that the load of the output portion of the transimpedance amplifier can be reduced. Therefore, a light receiving circuit is provided in which, even when a high-speed response is performed, an accurate amplifying operation can be achieved with respect to an input optical or electrical signal having a wide dynamic range. Also, since only one comparison circuit is used, a configuration which provides a small area and low power consumption can be achieved.

Further, since a configuration is provided in which, even when an L-level data input is changed to an H-level data input, a high-speed response is obtained with respect to the H-level data after input of the L-level data. Therefore, it is possible to prevent an erroneous reaction to the L-level data input, resulting in an accurate AGC operation.

In addition, a high-speed response can be obtained with respect to input data input whose power is not constant and is gradually increased during, for example, a preamble period. Also in this case, an accurate AGC operation can be achieved.

With such a configuration, it is possible to provide a light receiving circuit which can address a wide dynamic range (i.e., from a small signal to a large signal), and receive data with high precision.

Further, according to the present invention, only two comparison circuits are used to adjust the output value of the transimpedance amplifier into an appropriate range, thereby making it possible to reduce the output load due to a small number of comparison circuits, perform a high-speed operation, and receive data with high precision due to accurate gain adjustment.

Figure 1:
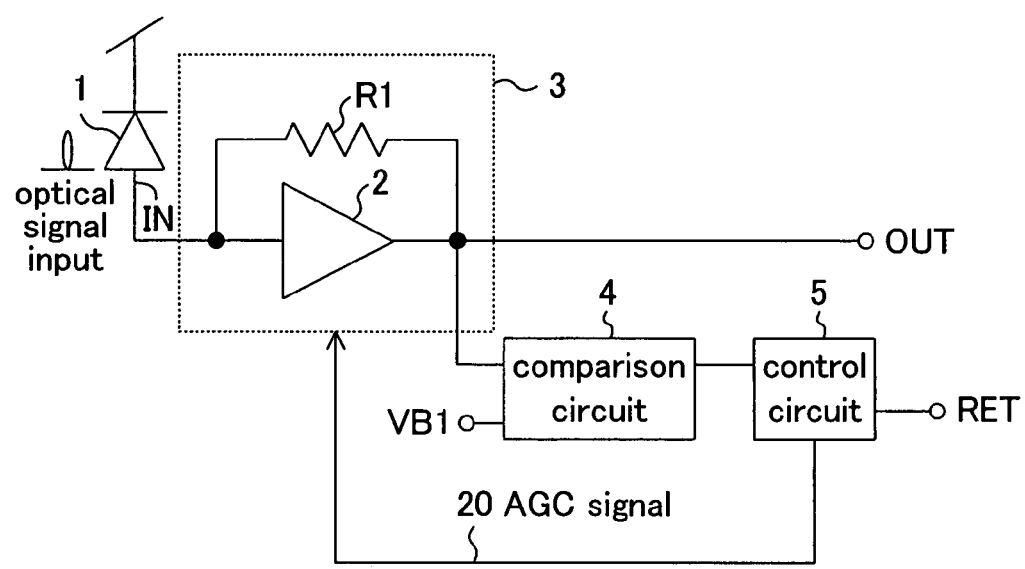
FIG. 1 is a block diagram of a light receiving circuit according to a first embodiment of the present invention.
Figure 2:
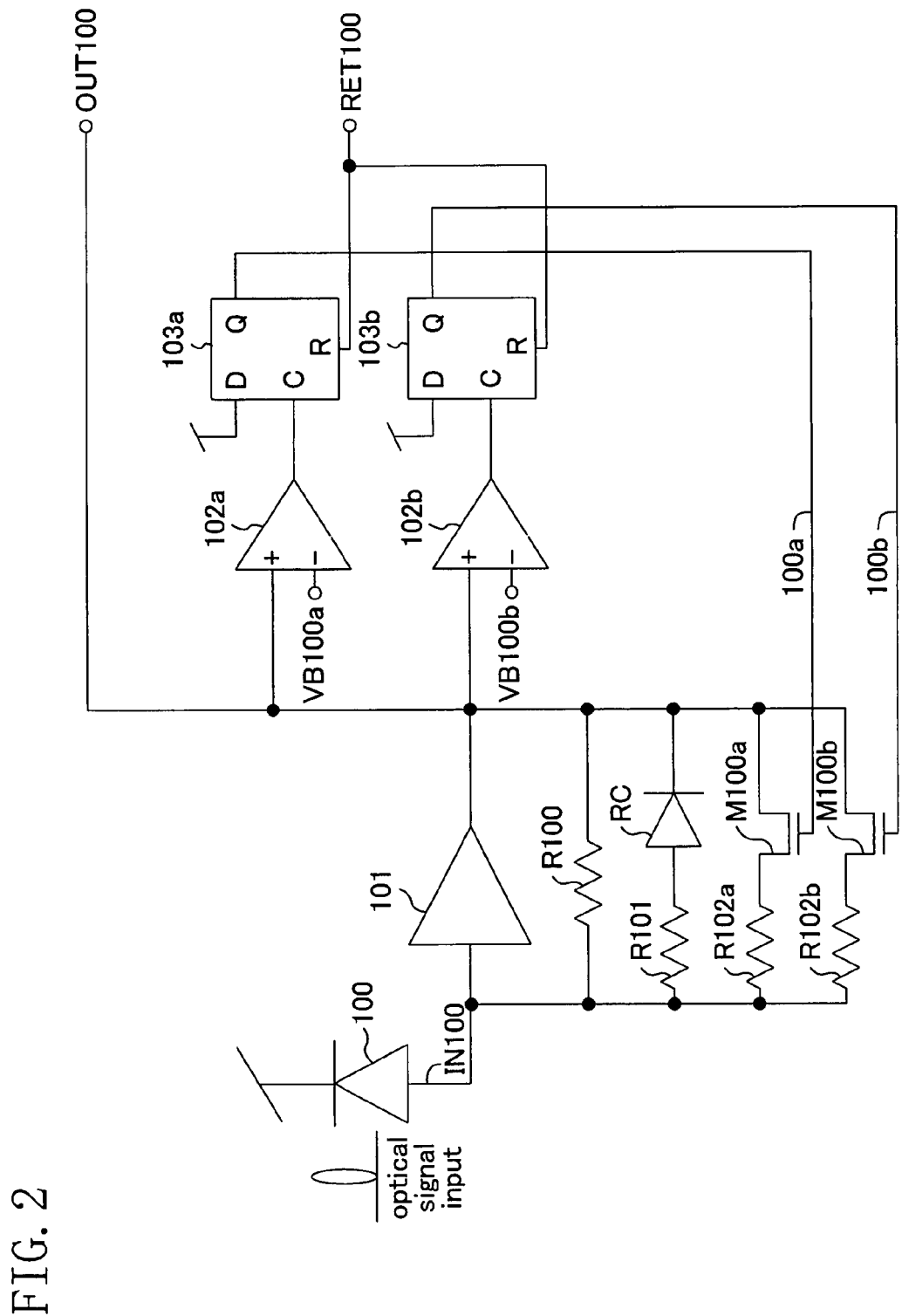
FIG. 2 is a block diagram of a conventional exemplary light receiving circuit.

DESCRIPTION OF THE REFERENCE CHARACTERS 2, 2a, 2b, . . . inversion amplifier
R1, R2a, R2b, . . . feedback resistance
3 transimpedance amplifier
4, 16 comparison circuit
5, 14 control circuit
6a, 6b, . . . latch circuit
7, 9, 10, 15 control signal generating circuit
8 reset signal generating circuit
11a, 11b, . . . shift register circuit
12 reference value generating circuit
12a, 12b, . . . reference value generating circuit
13 amplification circuit
IN transimpedance amplifier input signal
OUT transimpedance amplifier output signal
MOUTa, MOUTb, . . . comparison result output by latch circuit
MOUT2a, MOUT2b, . . . comparison result output by shift register circuit
/MOUTa, /MOUTb, . . . reverse-phase signal of comparison result output by latch circuit
OUTA, OUTB differential amplification circuit output signal
RET reset signal
RETa, RETb, . . . held-value resetting signal
RET2, RET2a, RET2b, . . . intermediate value reset signal
VB1 reference value (first comparative value)
VB2 reference value (second comparative value)
100a, 100b, . . . feedback resistance switch signal
20 AGC signal
21 STOP signal
22 STOP2 signal
MSWa, MSWb, . . . switch (intermediate value selecting switch)
MSWSa, MSWSb, . . . select signal

BEST MODE FOR CARRYING OUT THE INVENTION

Hereinafter, embodiments of the present invention will be described with reference to the accompanying drawings.

First Embodiment

Initially, a first embodiment of a light receiving circuit of the present invention will be described with reference to FIG. 1.

The light receiving circuit of FIG. 1 comprises: a light receiving element 1 for receiving an optical input signal and outputting a current proportional to the intensity of the input light; a transimpedance amplifier 3 comprising an inversion amplifier 2 for amplifying an electrical signal which is an output current obtained by photoelectric conversion of the light receiving element 1 and a feedback resistance R1 connected between an input IN and an output OUT of the inversion amplifier 2; a comparison circuit 4 for receiving an output of the transimpedance amplifier 3, comparing the output with a reference value (first comparative value) VB1 which is set to have a certain desired value to determine the level of the output of the transimpedance amplifier 3, and outputting the comparison result; and a control circuit 5 for holding the comparison result of the comparison circuit 4, and depending on the comparison result, generating an AGC signal (a control signal for gain adjustment) 20 to adjust a gain of the transimpedance amplifier 3.

Note that the transimpedance amplifier 3 is assumed to have a function capable of adjusting the gain, depending on the input of the AGC signal 20. It is also assumed that the control circuit 5 of this embodiment performs a control to reduce the gain when an excessively large input signal is input.

Here, an operation of the thus-configured light receiving circuit will be described. Firstly, when the light receiving element 1 receives input light having a small amplitude, the light receiving element 1 outputs a current which is proportional to the intensity of the input light, and the transimpedance amplifier 3 amplifies the input light having the small amplitude and outputs the result. The comparison circuit 4 compares the output signal OUT of the transimpedance amplifier 3 and the reference value VB1 which is set to be a certain desired value, and outputs the comparison result. However, when a current having a small amplitude is input, the amplitude of an output signal obtained by inversion and amplification by the transimpedance amplifier 3 is small, and is not lower than the reference value VB1 which is set to be the certain desired value. Therefore, the comparison circuit 4 does not output a signal indicating that the output signal OUT is lower than the reference value VB1, and the control circuit 5 does not output the AGC signal 20 for adjusting the gain of the transimpedance amplifier 3. Therefore, the transimpedance amplifier 3 continues to amplify an input current with an invariably constant gain and output the result.

Next, when the light receiving element 1 receives input light having a large amplitude, the light receiving element 1 outputs a current which is proportional to the input light, and the transimpedance amplifier 3 amplifies the input current having the large amplitude and outputs the result. The comparison circuit 4 compares the output signal OUT obtained by inversion and amplification by the transimpedance amplifier 3 and the reference value VB1 which is set to be the certain desired value, and when the output signal OUT is an excessively large signal which is lower than the reference value VB1, outputs a signal indicating the output signal OUT is lower than the reference value VB1. The control circuit 5, which has received the comparison signal, holds the received comparison signal, and outputs the AGC signal 20 for adjusting the gain of the transimpedance amplifier 3. The transimpedance amplifier 3 is adjusted to suppress the gain in accordance with the AGC signal 20 received from the control signal 5, and amplifies an input current using the newly set gain and outputs the result. The comparison circuit 4, which has received the output signal OUT after the gain adjustment, further compares the output signal OUT obtained using the newly set gain of the transimpedance amplifier 3 and the reference value VB1 which is set to be the certain desired value, and when the output signal OUT is lower than the reference value VB1, outputs again a signal indicating that the output signal OUT is lower than the reference value VB1. Thus, while the output signal of the transimpedance amplifier is lower than the reference value VB1, the comparison circuit 4 continues to compare the signal level, and the control circuit 5 holds the comparison result from the comparison circuit 4 and outputs the AGC signal 20 to continue to adjust the gain of the transimpedance amplifier 3. Thereafter, when the gain of the transimpedance amplifier 3 is suppressed to a low level, and the output signal OUT exceeds the reference value VB1, the comparison circuit 4 no longer outputs a signal indicating that the output signal OUT is lower than the reference value VB1, and the control circuit 5 continues to output the currently set AGC signal 20, and the transimpedance amplifier 3 continues to amplify the input current using the currently set gain and output the result.

Note that it has been here described that, when the output signal OUT is lower than the reference value VB1, the comparison circuit 4 outputs a signal indicating the output signal OUT is lower than the reference value VB1. Alternatively, for example, the reference value VB1 may be set or the comparison circuit 4 may be configured so that, when the output signal OUT is higher than the reference value VB1, the comparison circuit 4 outputs a signal indicating that the output signal OUT is higher than the reference value VB1.

Similarly, although it has been described that comparison is continued until the output signal of the transimpedance amplifier 3 exceeds the reference value VB1, for example, the reference value VB1 may be set or the comparison circuit 4 may be configured so that comparison is continued until the output signal of the transimpedance amplifier 3 falls below the reference value VB1.

Also, although it has been described that the AGC signal 20 for adjusting the gain of the transimpedance amplifier 3 is a single control signal, a plurality of AGC signals may be used.

Figure 22:
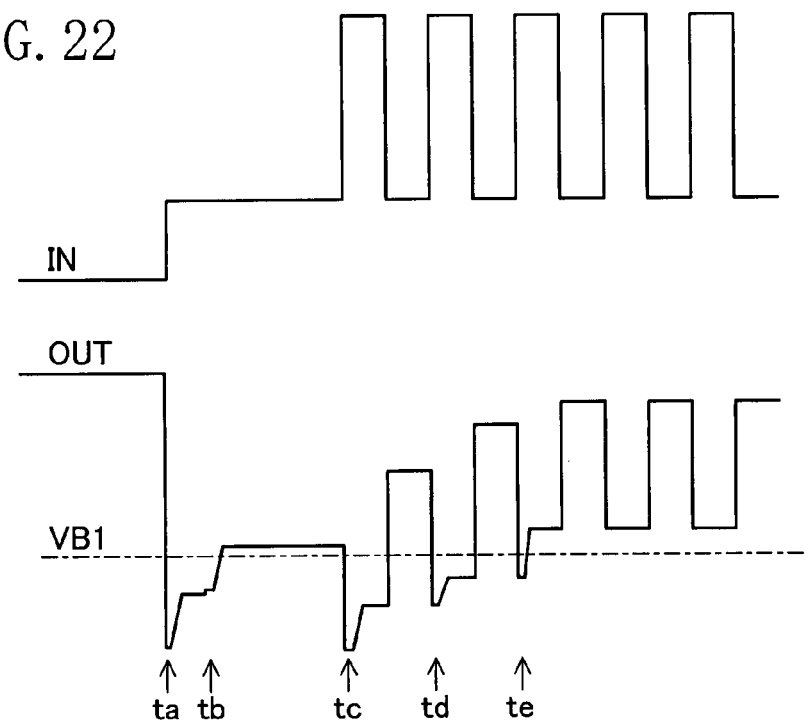
FIG. 22 is a timing chart of input and output signals of the transimpedance amplifier of the first embodiment of the present invention.

FIG. 22 illustrates a timing chart of an operation of the input signal IN of the transimpedance amplifier 3, the output signal OUT of the transimpedance amplifier 3, and a comparison operation with the predetermined reference voltage VB1 previously set. In FIG. 22, while the output signal OUT is lower than the reference voltage VB1 (e.g., at times ta to te indicated with arrows), the gain of the transimpedance amplifier 3 continues to be adjusted, so that the amplitude of the output signal OUT is gradually reduced from time ta toward time te. Thereafter, when the output signal OUT exceeds the reference voltage VB1, the comparison circuit 4 no longer outputs a signal indicating that the output signal OUT is lower than the reference voltage VB1 as described in FIG. 1. Thereby, the control circuit 5 no longer newly generates the AGC signal 20 for adjusting the gain of the transimpedance amplifier, so that the gain of the transimpedance amplifier 3 and the amplitude of the output signal OUT are constant, and thereafter, the amplitude is output without a change.

Also, although the AGC function is operated every time data is at the H level in FIG. 22, the AGC function may be operated with any timing as long as the gain of the transimpedance amplifier 3 is optimally set.

Although it has been here explicitly described that the transimpedance amplifier 3 has a function capable of adjusting the gain when receiving the AGC signal 20, the function may be implemented using an inversion amplifier with a gain adjusting function.

Figure 18:
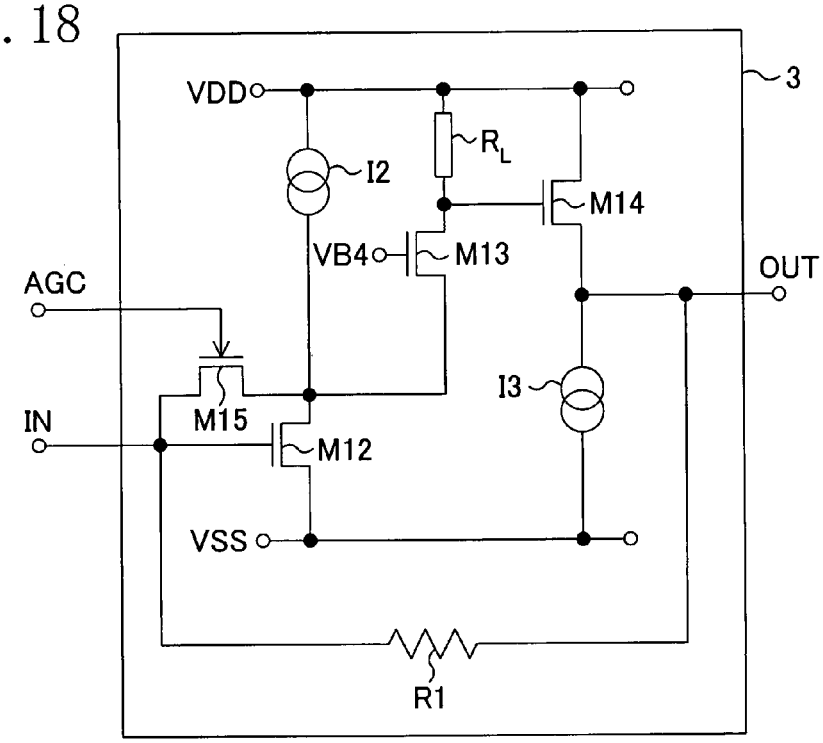
FIG. 18 is a circuit diagram illustrating an exemplary configuration A of a transimpedance amplifier according to a first embodiment of the present invention.

As an example, FIG. 18 illustrates an inversion amplifier with a gain adjusting function. The inversion amplifier of FIG. 18 comprises: an NMOS transistor M12 having a gate to which an input signal IN is input, and a source connected to GND; an NMOS transistor M13 having a source connected to the drain of the NMOS transistor M12, and a gate to which a desired bias voltage VB4 is input; a load resistance RL connected between the drain of the NMOS transistor M13 and a power supply VDD; a current supply 12 between the drain of the NMOS transistor M12 and the power supply VDD; an NMOS transistor M14 having a gate connected to the drain of the NMOS transistor M13, and a drain connected to the power supply VDD; a current supply 13 connected between the source of the NMOS transistor M14 and GND; and a feedback resistance R1 connected between the gate of the NMOS transistor M12 and the source of the NMOS transistor M14. The inversion amplifier of FIG. 18 further comprises an NMOS transistor M15 having a source connected to the gate of the NMOS transistor M12, a drain connected to the drain of the NMOS transistor M12, and a gate to which a control voltage AGC signal is applied, which is added to the transimpedance amplifier 3 which outputs the output signal OUT from the source of the NMOS transistor M14.

In this configuration, when a large current is input, by the AGC signal 20 being applied to the gate of the NMOS transistor M15, the NMOS transistor M15 extracts an excess current, and the gain of the inversion amplifier is reduced, so that the saturation of the transimpedance amplifier 3 can be suppressed.

Note that the above description is only for illustrative purposes, and an inversion amplifier having any configuration may be used as long as it has a gain adjusting function.

Figure 19:
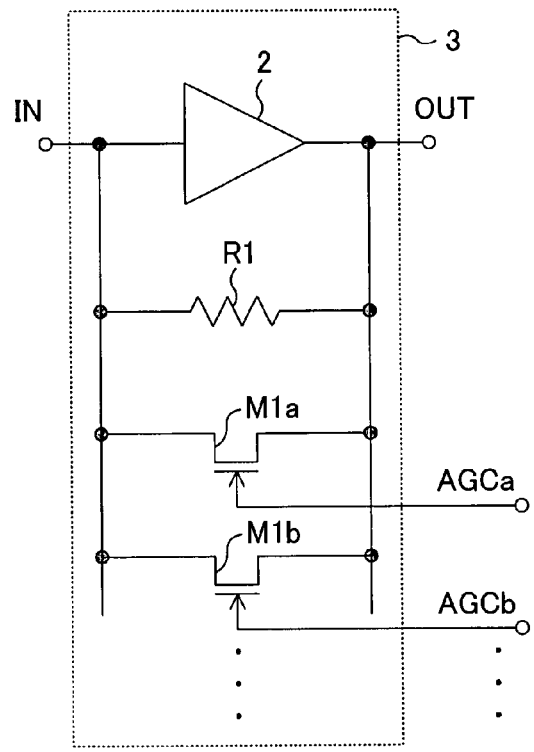
FIG. 19 is a circuit diagram illustrating an exemplary configuration B of the transimpedance amplifier of the first embodiment of the present invention.

Also, as illustrated in FIG. 19, in the transimpedance amplifier 3, a plurality of NMOS transistors M1a, M1b, . . . connected in parallel to the feedback resistance R1 may be prepared. Control signals AGCa, AGCb, . . . for adjusting the gain of the transimpedance amplifier 3 may be applied to one or a plurality of NMOS transistors M1a, M1b, . . . connected in parallel, thereby utilizing the ON resistance values to adjust the gain of the transimpedance amplifier 3.

Although, here, the gain of the transimpedance amplifier 3 is adjusted using an NMOS transistor, a PMOS transistor may be used, or both an NMOS transistor and a PMOS transistor may be used.

Figure 20:
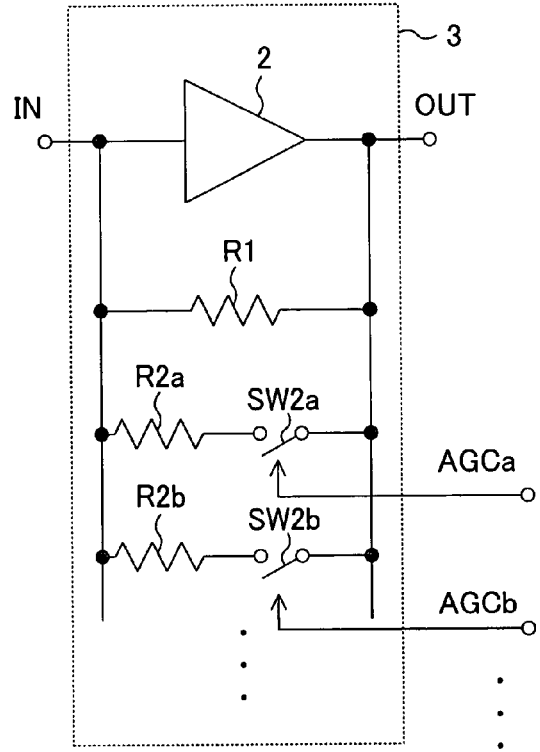
FIG. 20 is a circuit diagram illustrating an exemplary configuration C of the transimpedance amplifier of the first embodiment of the present invention.

As illustrated in FIG. 20, in the transimpedance amplifier 3, a feedback resistance R1, and one or a plurality of feedback resistances R2a, R2b, . . . and switches SW2a, SW2b, . . . which are connected in series, respectively, each pair of which is connected in parallel to the feedback resistance R1, may be prepared. The switches SW2a, SW2b, . . . may be switched ON/OFF in accordance with control signals AGCa, AGCb, . . . for adjusting the gain of the transimpedance amplifier 3, thereby adjusting the gain of the transimpedance amplifier 3.

Figure 21:
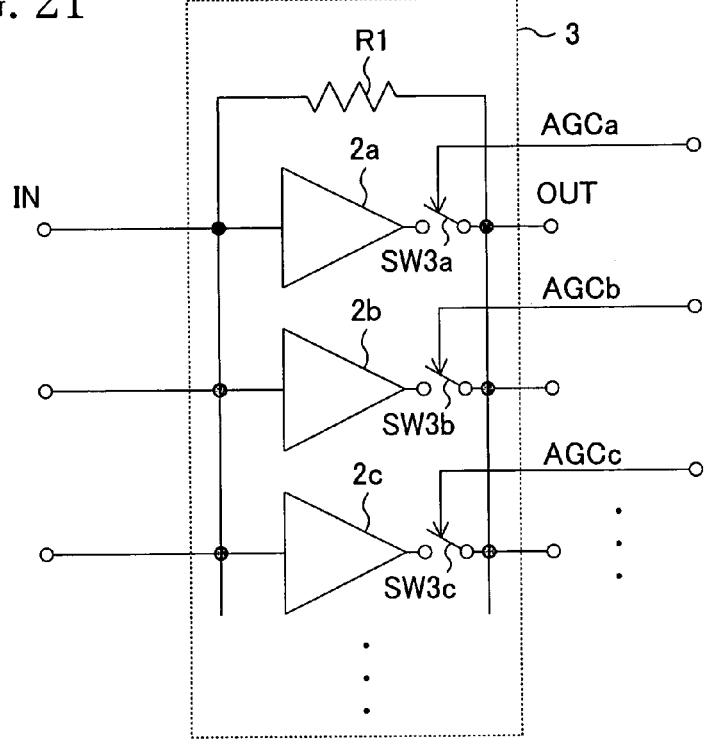
FIG. 21 is a circuit diagram illustrating an exemplary configuration D of the transimpedance amplifier of the first embodiment of the present invention.

Further, as illustrated in FIG. 21, in the transimpedance amplifier 3, one or a plurality of inversion amplifiers 2a, 2b, . . . , and switches SW3a, SW3b, . . . for switching the respective inversion amplifiers may be prepared. The switches SW3a, SW3b, . . . may be switched ON/OFF to select an appropriate inversion amplifier, thereby adjusting the gain and band of the transimpedance amplifier 3.

Thus, several functions capable of adjusting the gain of the transimpedance amplifier 3 have been described. These functions may be used alone or in combination. Any other methods may be used as long as they can adjust the gain of the transimpedance amplifier 3.

Figure 14:
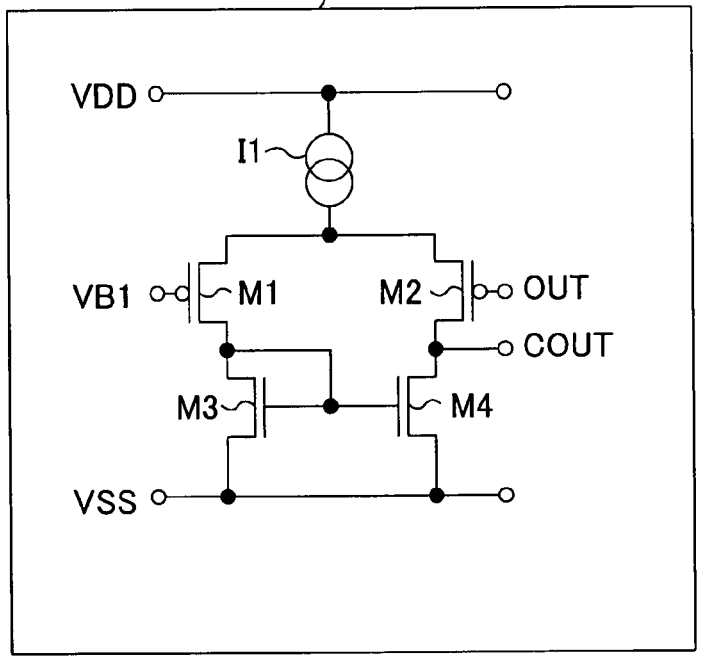
FIG. 14 is a circuit diagram of a comparison circuit according to the first embodiment of the present invention.

Next, FIG. 14 illustrates a specific example of the comparison circuit 4. The comparison circuit 4 of FIG. 14 comprises: a PMOS transistor M1 having a gate to which a predetermined reference voltage VB1 previously set is input; a PMOS transistor M2 having a source connected to the source of M1, and a gate to which the output signal OUT of the transimpedance amplifier 3 is input; an NMOS transistor M3 having a drain connected to the drain of the PMOS transistor M1, and a source connected to GND; an NMOS transistor M4 having a drain connected to the drain of the PMOS transistor M2, a gate connected to the drain and the gate of the NMOS transistor M3, and a source connected to GND; and a current supply I1 connected between the sources of the PMOS transistors M1 and M2 and a power supply VDD. The comparison circuit 4 of FIG. 14 outputs an output signal COUT from the drain of the NMOS transistor M4.

Here, an operation of the thus-configured comparison circuit will be described. The comparison circuit 4 of FIG. 14 compares the predetermined reference voltage VB1 previously set and the output signal OUT of the transimpedance amplifier 3. When the output signal OUT of the transimpedance amplifier 3 is lower than the predetermined reference voltage VB1 previously set, a current flows through the PMOS transistor M2, so that the output signal COUT goes to H.

Note that the configuration described here is only for illustrative purposes. Any configuration in which the output of the transimpedance amplifier 3 and the desired reference value VB1 can be compared may be used. Also, the polarity of the output signal may be reversed.

With the configuration of this embodiment, although a plurality of reference values and a plurality of comparison circuits are conventionally required to adjust the gain of the transimpedance amplifier 3, the present invention can similarly adjust the gain of the transimpedance amplifier 3 by providing a configuration which includes only one reference value and only one comparison circuit. Also, since only one comparison circuit is connected, the load of the output node of the transimpedance amplifier 3 can be set to be small. Therefore, it is possible to provide a light receiving circuit which can provide a response with high precision with respect to an input having a wide dynamic range even when the response has high speed. Also, since only one reference value and only one comparison circuit are used, a small area and low power consumption can be achieved.

Further, by inputting a plurality of reset signals to the control circuit 5 or inputting one or a plurality of reset signals RET to the control circuit 5 to generate a plurality of reset signals based on those signals, the comparison result held can be initialized (reset) as required, so that a discontinuous signal (e.g., a burst signal, etc.) can be addressed. Also, by using the reset signals RETa, RETb, . . . , the output of the comparison circuit 4 can be successively held by the control circuit 5, and the AGC signal 20 for adjusting the gain of the transimpedance amplifier 3 can be generated. A specific example of such a control circuit 5 will be described with reference to FIGS. 3 to 8.

Figure 3:
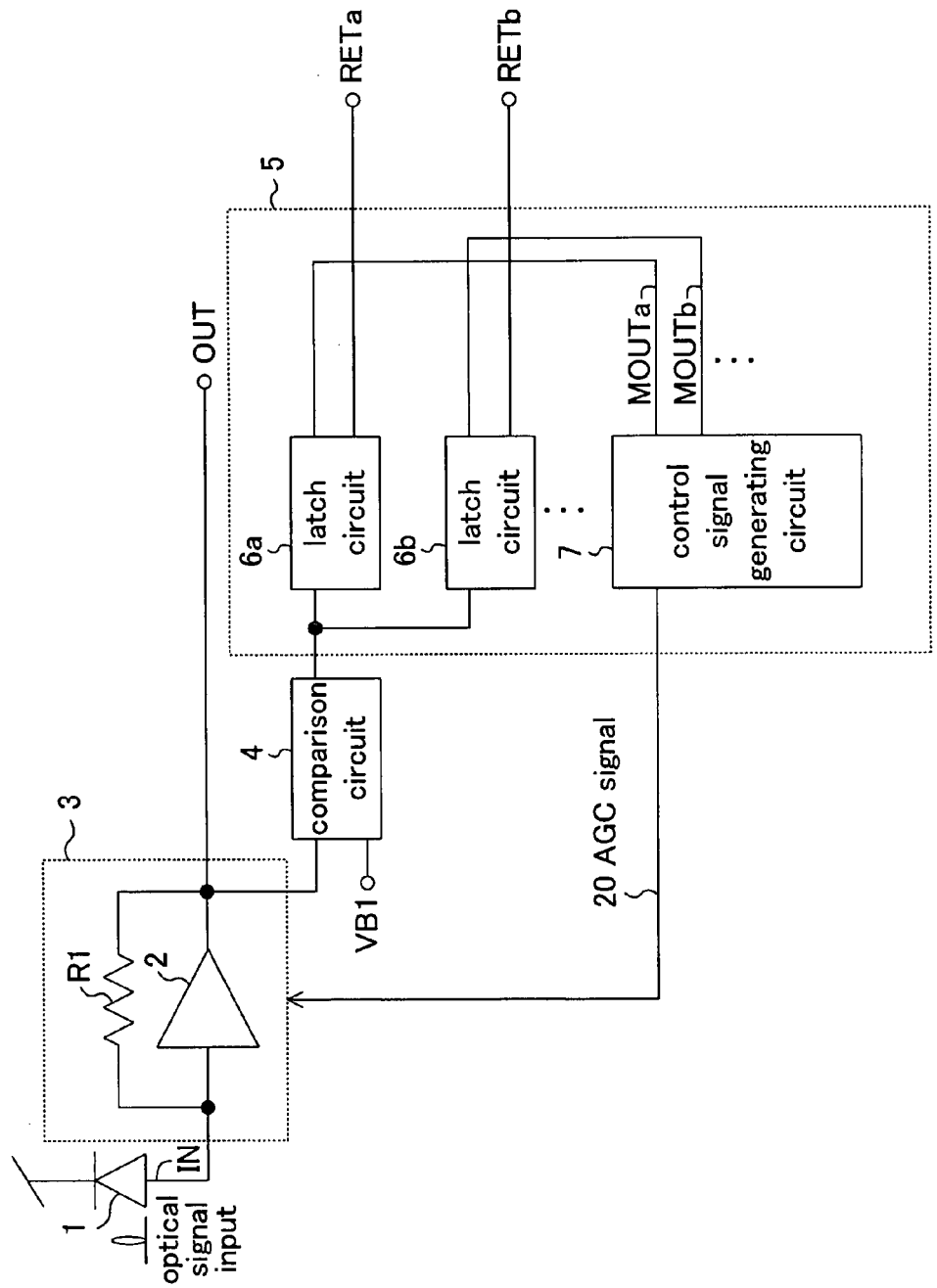
FIG. 3 is a block diagram illustrating a specific example A of a control circuit according to the first embodiment of the present invention.

Firstly, FIG. 3 illustrates a specific example A of the control circuit 5 according to a first embodiment of the present invention. Note that, in FIG. 3, parts other than the internal configuration of the control circuit 5 have been described in FIG. 1, and therefore, the same parts will not be described.

The control circuit 5 of FIG. 3 comprises: a plurality of latch circuits 6a, 6b, . . . for holding the comparison result output from the comparison circuit 4; and a control signal generating circuit 7 for generating an AGC signal 20 as a control signal for adjusting the gain of the transimpedance amplifier 3 based on results MOUTa, MOUTb, output from the latch circuits 6a, 6b, . . . .

Here, an operation of the thus-configured control circuit 5 will be described. In the control circuit 5, initially, the latch circuits 6a, 6b, . . . are reset into non-operating states by respective reset signals (held-value reset signals) RETa, RETb, . . . . Next, the reset signal RETa input to the latch circuit 6a is disabled (reset is released), so that the latch circuit 6a goes into an operating state, whereby the result of comparison of the output OUT of the transimpedance amplifier 3 and the reference value VB1 is held as the comparison result MOUTa in the latch circuit 6a, and the comparison result MOUTa is output.

The control signal generating circuit 7 uses the comparison result MOUTa to output the AGC signal 20 for adjusting the gain of the transimpedance amplifier 3, and the transimpedance amplifier 3 outputs a signal amplified using the adjusted gain. Next, the reset of the latch circuit 6b is released using the reset signal RETb, so that the latch circuit 6b is operated, whereby the result of comparison of the output OUT of the gain-adjusted transimpedance amplifier 3 and the reference value VB1 is held, and the comparison result MOUTb is output. The control signal generating circuit 7 uses the comparison result MOUTb to output the AGC signal 20 for adjusting the gain of the transimpedance amplifier 3, and the transimpedance amplifier 3 outputs a signal amplified using the adjusted gain.

Thus, when the reset of the latch circuits 6a, 6b, . . . is successively released with certain desired timing, the results of comparison of the output OUT of the transimpedance amplifier 3 and the reference value VB1 are successively held in the latch circuits 6a, 6b, . . . . Therefore, the control signal generating circuit 7 uses the comparison results MOUTa, MOUTb, . . . to successively generate the AGC signal 20 for adjusting the gain of the transimpedance amplifier, and adjusts the gain of the transimpedance amplifier 3 until the output OUT of the transimpedance amplifier 3 eventually exceeds the reference value VB1.

Further, the reset signals RETa, RETb, . . . are newly input to the latch circuits 6a, 6b, . . . to reset the latch circuits 6a, 6b, . . . , thereby initializing the latch circuits 6a, 6b, . . . , so that the AGC function can be newly operated.

Also, although it has been here explicitly described that the control signal generating circuit 7 outputs the AGC signal 20 for adjusting the gain of the transimpedance amplifier 3, the comparison results MOUTa, MOUTb, . . . may be directly used as control signals.

Figure 4:
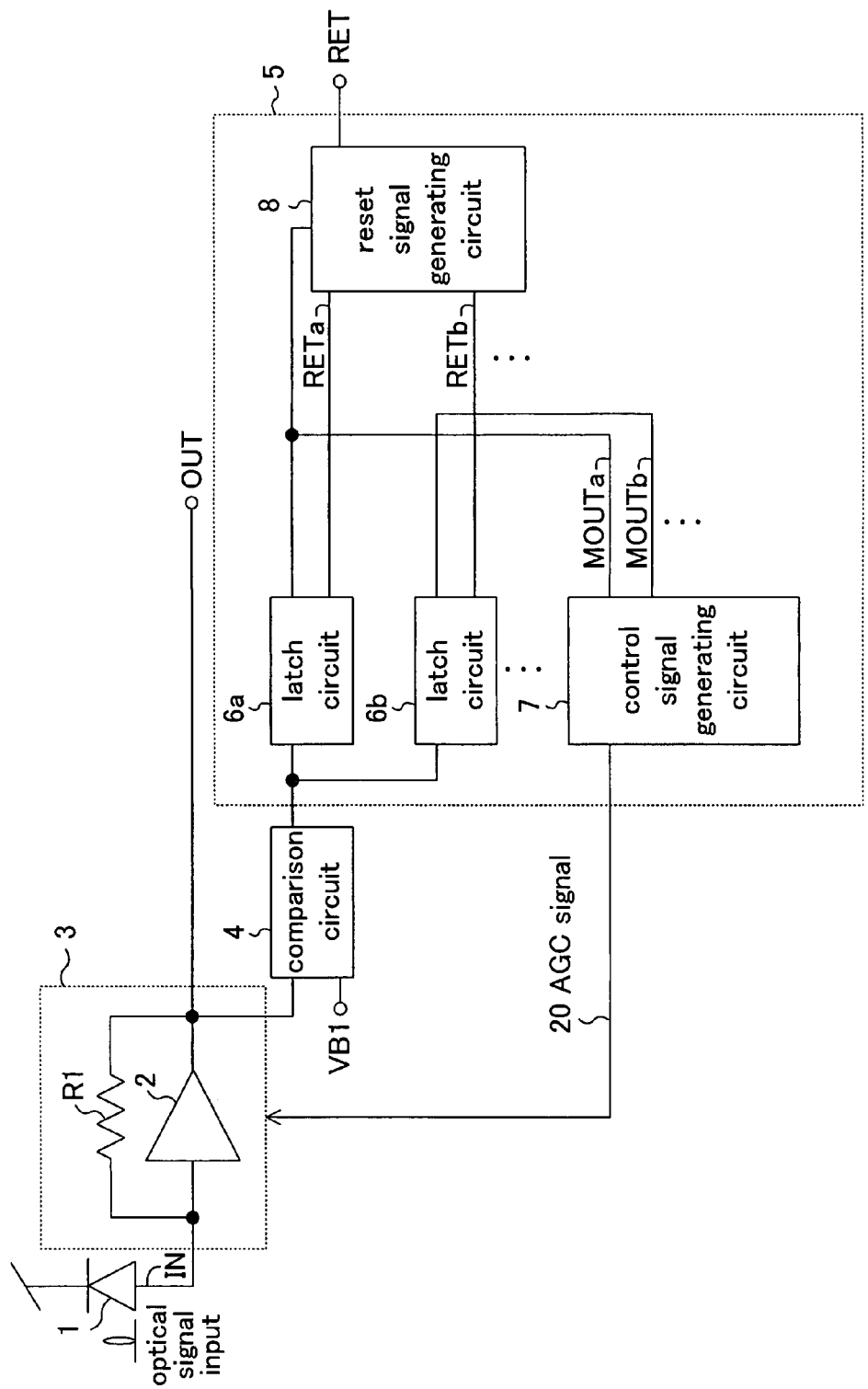
FIG. 4 is a block diagram illustrating a specific example B of the control circuit of the first embodiment of the present invention.

FIG. 4 illustrates a specific example B of the control circuit 5 of this embodiment.

It has been assumed in the specific example A of the control circuit 5 of FIG. 3 that the reset signals RETa, RETb, . . . are successively input to the latch circuits 6a, 6b, . . . . The reset signals may be externally input in order of RETa, RETb, . . . with predetermined or optimal timing. However, when the number of input signals is large, it is difficult to externally adjust the configuration and the timing. Therefore, the control circuit 5 of this embodiment of FIG. 4 has a configuration in which, when one or a plurality of reset signals RET are externally received, reset signals (held-value reset signals) RETa, RETb, . . . to be input to the latch circuits 6a, 6b, . . . are internally generated in a reset signal generating circuit 8.

In addition, the reset signals RETa, RETb, . . . may be generated based on the reset signal RET using a delay circuit. Any other configuration which can release reset with optimal timing may be used.

Further, reset signals may be generated as follows. Initially, the reset of only the latch circuit 6a is released using the reset signal RETa. Only when the output signal of the latch circuit 6a changes, i.e., the output OUT of the transimpedance amplifier 3 falls below the reference value VB1, the remaining reset signals RETb, . . . are generated. In this case, only when the input current of the transimpedance amplifier 3 is large and the AGC function is required, a reset signal is generated, resulting in low noise and low power consumption in normal use.

Figure 5:
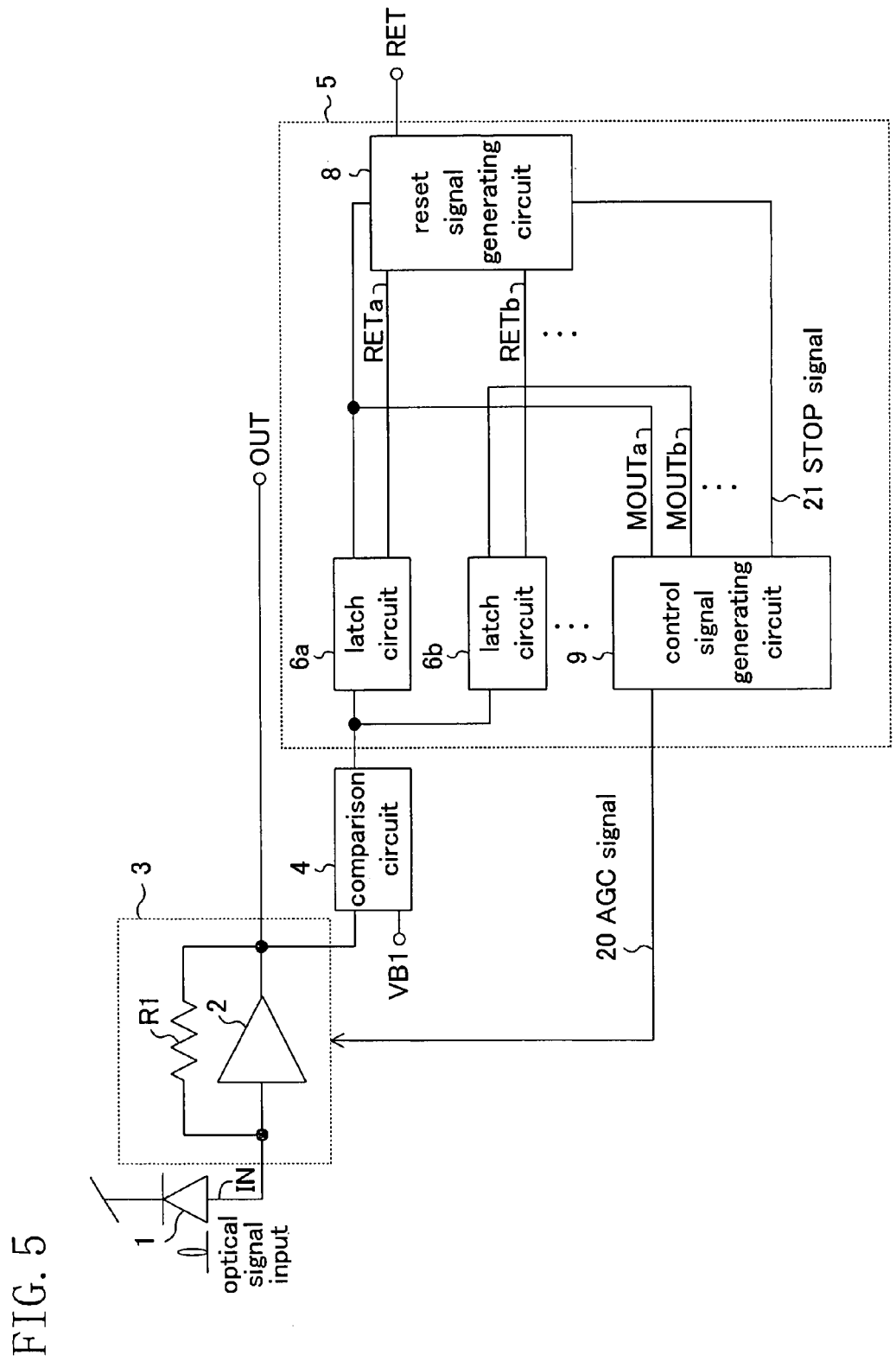
FIG. 5 is a block diagram illustrating a specific example C of the control circuit of the first embodiment of the present invention.

FIG. 5 illustrates a specific example C of the control circuit 5 of this embodiment.

In this embodiment, in addition to the specific example B of FIG. 4 of the control circuit 5, a function is added in which the gain of the transimpedance amplifier 3 is appropriately adjusted, and when the output OUT of the transimpedance amplifier 3 exceeds the reference value (first comparative value) VB1, the control signal generating circuit 7 transmits a STOP signal 21 to the reset signal generating circuit 8 so that the current state of the reset signal generating circuit 8 is held, and a new latch operation is not operated.

Thereby, when the output OUT of the transimpedance amplifier 3 exceeds the reference value VB1, so that the gain adjustment of the transimpedance amplifier 3 is no longer required, the operations of the reset signal generating circuit and the latch circuit are stopped, thereby stopping a useless circuit operation and output, resulting in an improvement in noise characteristics and low power consumption.

Figure 6:
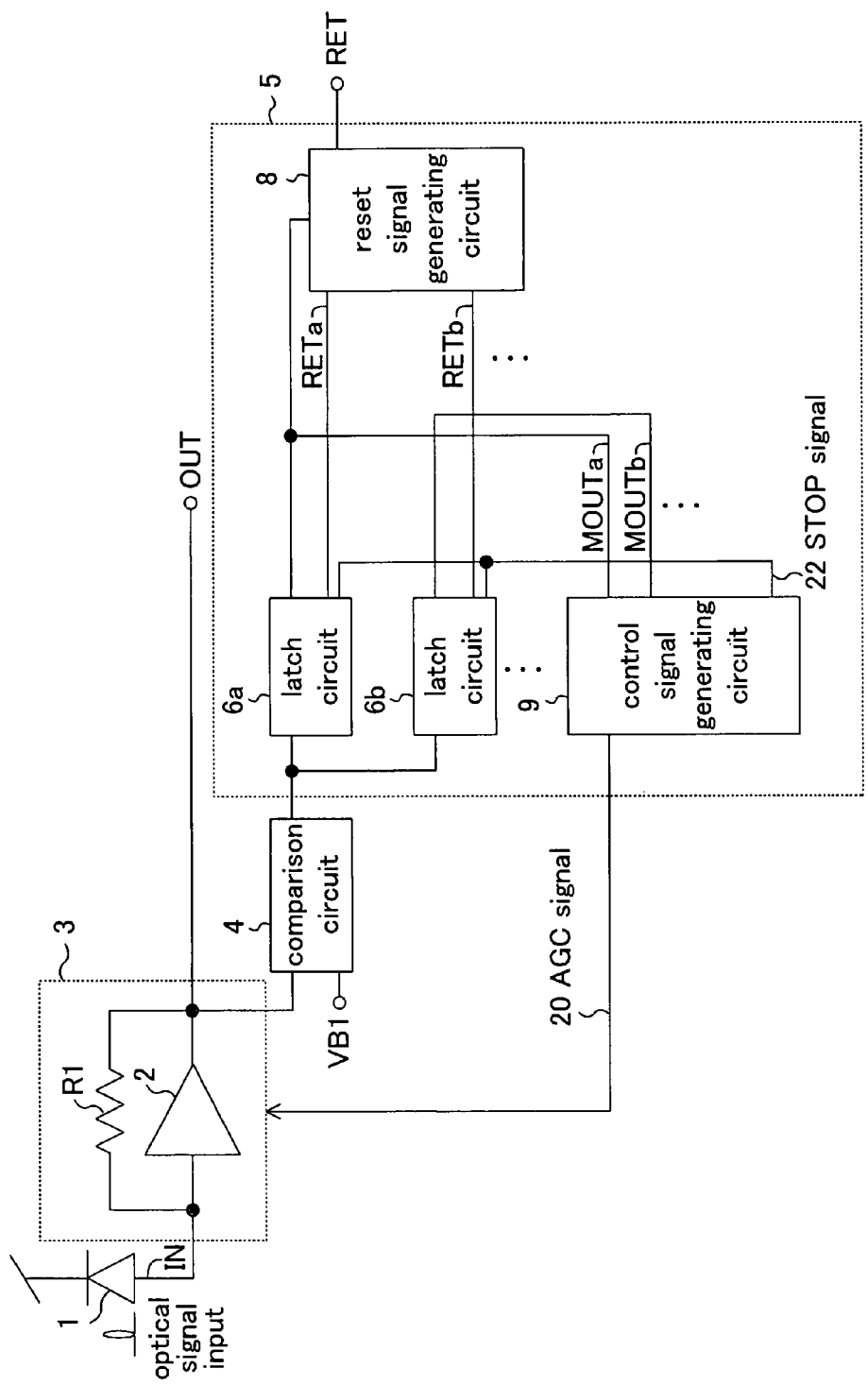
FIG. 6 is a block diagram illustrating a specific example D of the control circuit of the first embodiment of the present invention.

FIG. 6 illustrates a specific example D of the control circuit 5 of this embodiment.

In this embodiment, in addition to the specific example B of FIG. 4 of the control circuit 5, a function is added in which the gain of the transimpedance amplifier 3 is appropriately adjusted, and when the output OUT of the transimpedance amplifier 3 exceeds the reference value (first comparative value) VB1, the control signal generating circuit 7 transmits a STOP2 signal 22 to the latch circuits 6a, 6b, . . . , so that the current states of the latch circuits 6a, 6b, . . . are held, and a new signal is not generated.

Although it has been here explicitly described that the operations of the latch circuits 6a, 6b, . . . are stopped, the operations of all the latch circuits 6a, 6b, . . . may be stopped while all data are held separately, or alternatively, only a latch circuit(s) which are not used may be stopped.

Also, the operations of the latch circuits 6a, 6b, . . . may be stopped by a configuration in which the reset signals RETa, RETb, . . . and the STOP2 signal 22 are logically added so that the reset signals RETa, RETb, . . . function when the STOP2 signal 22 is input. Alternatively, a latch circuit may be forcedly stopped.

Thereby, when the output OUT of the transimpedance amplifier 3 exceeds the reference value VB1, so that the gain adjustment of the transimpedance amplifier 3 is no longer required, the operation of a latch circuit is stopped, thereby stopping a useless circuit operation and output, resulting in an improvement in noise characteristics and low power consumption.

Figure 7:
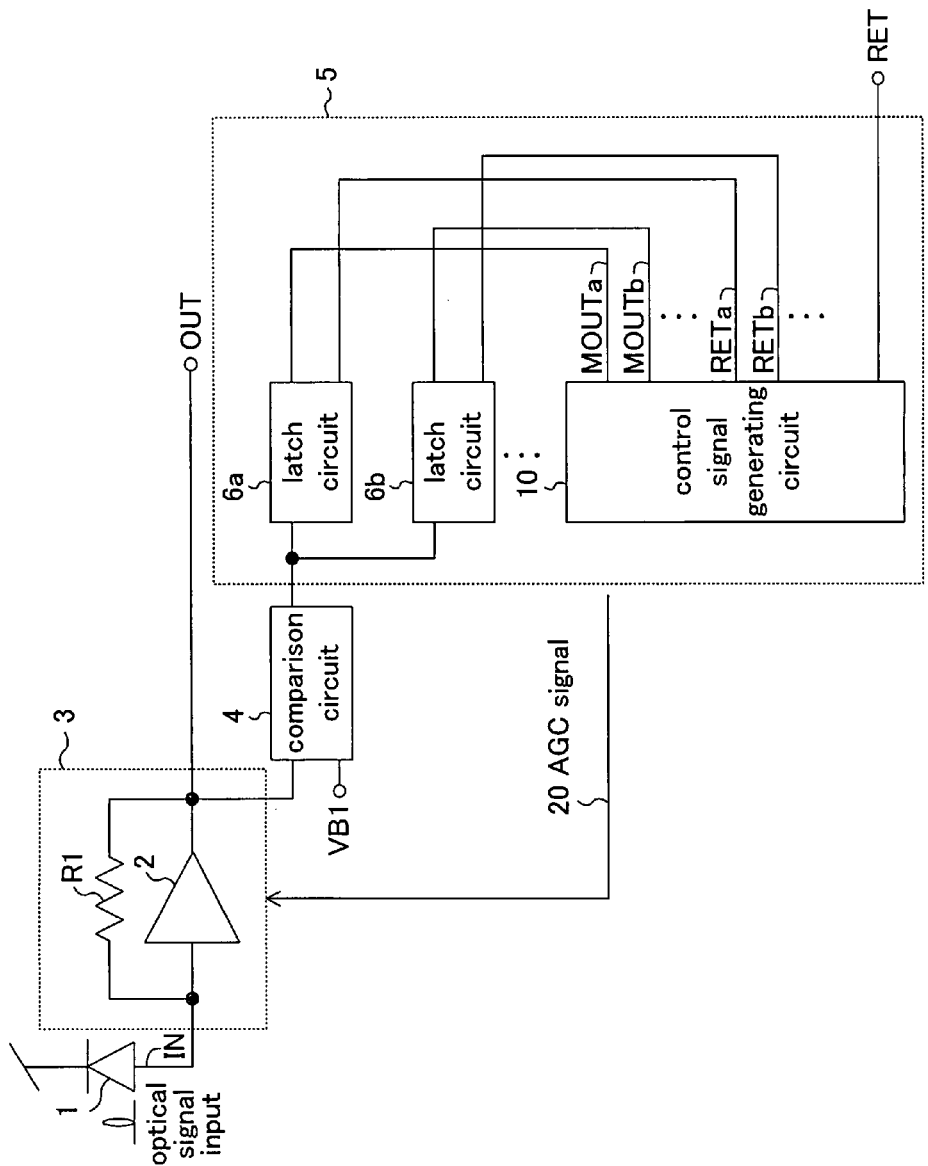
FIG. 7 is a block diagram illustrating a specific example E of the control circuit of the first embodiment of the present invention.

FIG. 7 illustrates a specific example E of the control circuit 5 of this embodiment.

Although the reset signals RETa, RETb, . . . are externally successively input to the latch circuits 6a, 6b, . . . in the specific example A of FIG. 3 of the control circuit 5, in this embodiment one or a plurality of reset signals RET are externally input to the control signal generating circuit 7, and based on the reset signals RET and the comparison results MOUTa, MOUTb, . . . output by the latch circuits 6a, 6b, . . . , reset signals (held-value reset signals) RETa, RETb, . . . are generated, and the generated reset signals RETa, RETb, . . . are input to the respective latch circuits 6a, 6b, . . . , thereby successively starting the operations of the latch circuits 6a, 6b, . . . .

Here, an operation of the thus-configured control circuit 5 will be described. The control signal generating circuit 10 generates the reset signals RETa, RETb, . . . based on the externally input reset signals RET to initialize the latch circuits 6a, 6b, . . . , which go to the non-operating state. Next, the reset signal RETa is used to release the reset of the latch circuit 6a, which in turn goes to the operating state to hold the result of comparison of the output OUT of the transimpedance amplifier 3 and the reference value VB1. When the comparison result MOUTa thus held is output, the gain of the transimpedance amplifier 3 is adjusted, and the transimpedance amplifier 3 outputs a signal amplified using the adjusted gain. Next, the reset signal RETb is generated with timing which is slightly delayed from the output of the comparison result MOUTa of the latch circuit 6a. Thereafter, as is similar to that described above, the reset of the latch circuit 6b is released using the reset signal RETb, and the result of comparison of the output OUT of the gain-adjusted transimpedance amplifier 3 and the reference value VB is held. Also, when the comparison result MOUTb thus held is output, the gain of the transimpedance amplifier 3 is adjusted, and the transimpedance amplifier 3 outputs a signal amplified using the adjusted gain.

Thus, based on the output comparison results MOUTa, MOUTb, . . . , the reset signals RETa, RETb, . . . are successively generated, so that the result of comparison of the output OUT of the gain-adjusted transimpedance amplifier 3 and the reference value VB1 is successively held by the latch circuits 6a, 6b, . . . , thereby making it possible to perform the AGC function operation with high-precision timing.

Further, in this configuration, although a stop signal is not newly generated, the comparison result MOUTn (hereinafter n represents a, b, . . . ) no longer changes and a new reset signal is no longer generated when the output OUT of the transimpedance amplifier 3 exceeds the reference value VB1. Therefore, a useless circuit operation can be removed, resulting in low power consumption.

Although it has been here assumed that the reset signal RETb is generated with timing which is slightly delayed from the output of the comparison result MOUTa, the timing may be provided using a delay circuit or any other configuration.

Figure 15:
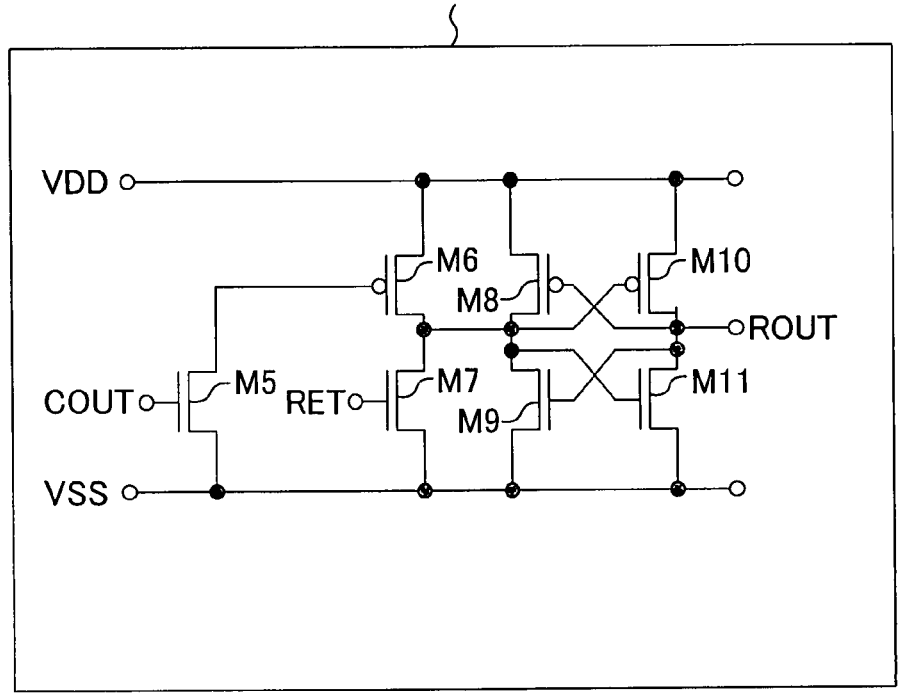
FIG. 15 is a circuit diagram of a latch circuit according to the first embodiment of the present invention.

Next, FIG. 15 illustrates a latch circuit 6 as a specific example of the latch circuits 6a, 6b, . . . . The latch circuit 6 comprises: an NMOS transistor M5 having a gate to which the output signal COUT of the comparison circuit 4 is input, and a source connected to GND; a PMOS transistor M6 having a gate connected to the drain of the NMOS transistor M5, and a source connected to VDD; an NMOS transistor M7 having a drain connected to the drain of the PMOS transistor M6, and a source connected to GND; a PMOS transistor M8 having a drain connected to the drain of the PMOS transistor M6, and a source connected to VDD; an NMOS transistor M9 having a drain connected to the drain of the PMOS transistor M6, and a source connected to GND; a PMOS transistor M10 having a gate connected to the drain of the PMOS transistor M8, a source connected to VDD, and further a drain connected to the gate of the PMOS transistor M8; and an NMOS transistor M11 having a gate connected to the drain of the NMOS transistor M9, a source connected to GND, and further a drain connected to the gate of the NMOS transistor M9 and the drain of the PMOS transistor M10. The latch circuit 6 outputs an output signal ROUT from the drain of the NMOS transistor M11.

Here, an operation of the thus-configured latch circuit 6 will be described. In the latch circuit 6, initially, when H is input to the reset signal RET, the NMOS transistor M7 is switched ON, so that positive feedback is applied to the PMOS transistor M8, the NMOS transistor M9, the PMOS transistor M10, and the NMOS transistor M11, the NMOS transistor M9 and the PMOS transistor M10 are switched ON, and H is output to the output signal ROUT. Next, after the reset signal RET is disabled by inputting L, when H is input to the output signal COUT of the comparison circuit 4, the NMOS transistor M5 and the PMOS transistor M6 are switched ON, so that positive feedback is applied to the PMOS transistor M8, the NMOS transistor M9, the PMOS transistor M10, and the NMOS transistor M11, and as a result, the PMOS transistor M8 and the NMOS transistor M11 are switched ON, and the output signal ROUT is changed to L.

Thereafter, positive feedback continues to be applied to the PMOS transistor M8, the NMOS transistor M9, the PMOS transistor M10, and the NMOS transistor M11, and therefore, the value continues to be held unless H is newly applied to the reset signal RET.

Although it has been here explicitly described that initialization is performed when H is input to the reset signal RET, the polarity of the signal may be reversed, depending on the configuration of the latch circuits 6a, 6b, . . . .

Also, the latch circuits 6a, 6b, are not limited to the above-described configuration. Any configuration may be used as long as the output signal of the comparison circuit 4 can be held.

Figure 16:
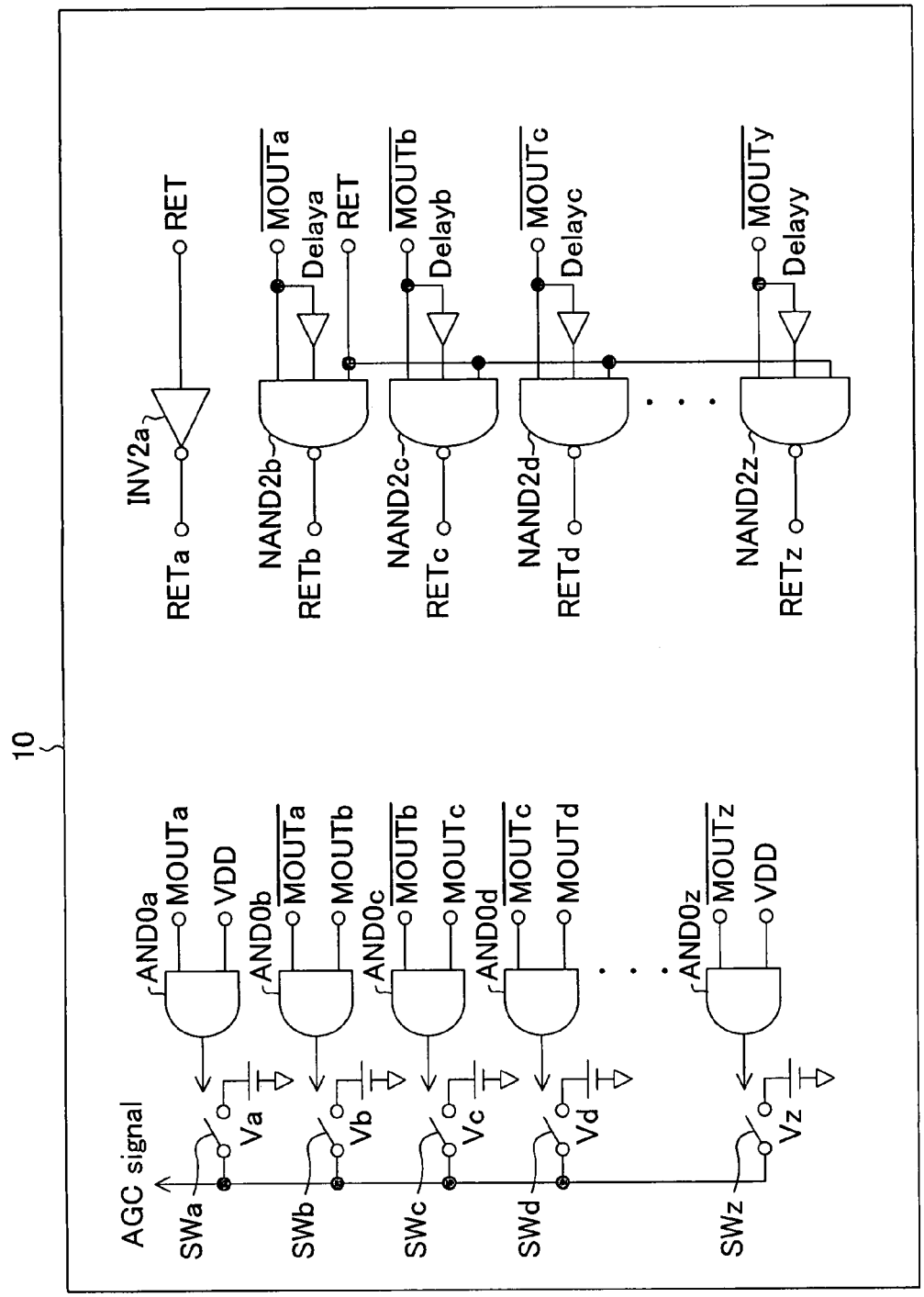
FIG. 16 is a circuit diagram of a control signal generating circuit according to the first, second and third embodiments of the present invention.
Figure 24:
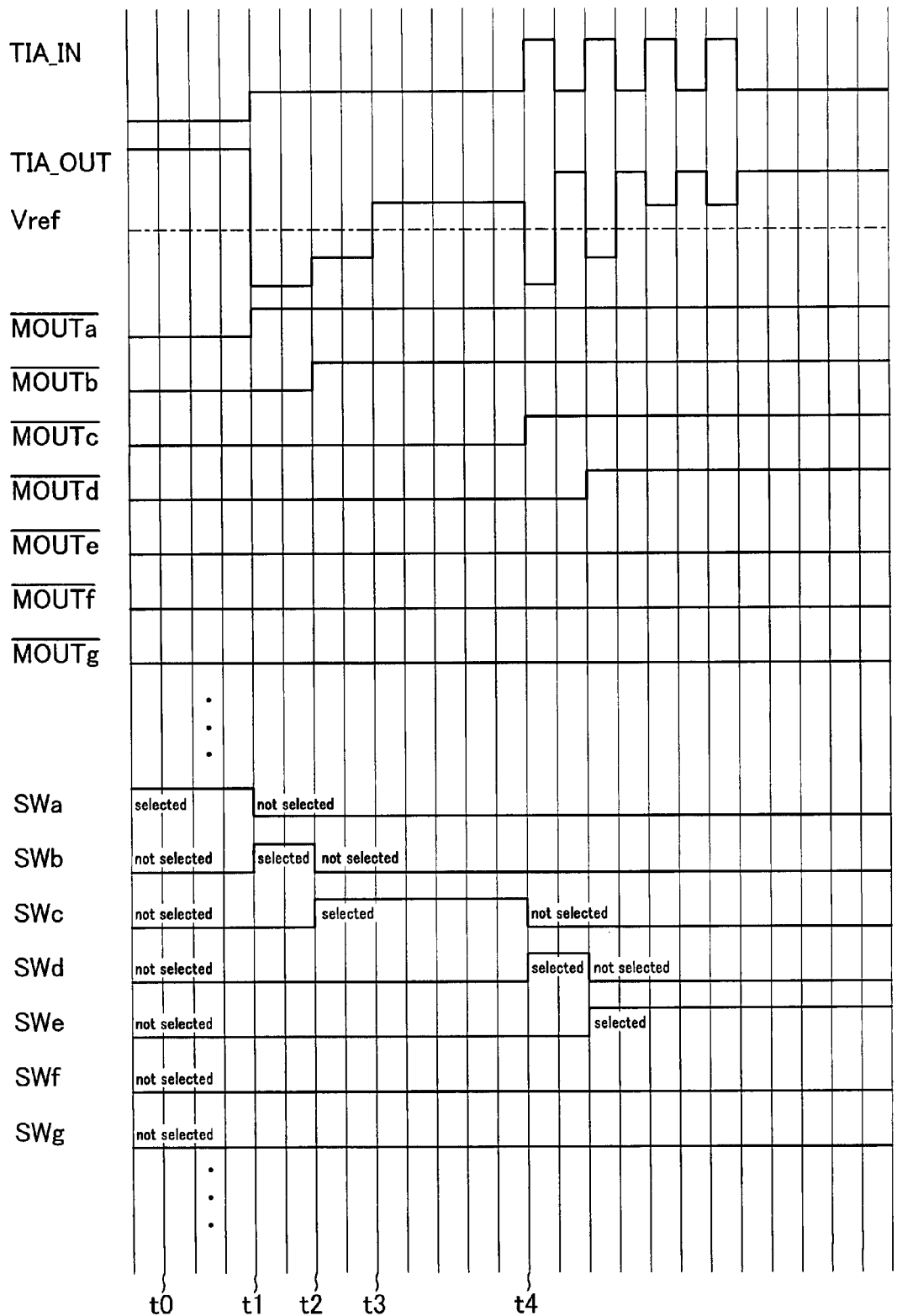
FIG. 24 is a timing chart of gain switches in the control signal generating circuit of the first, second and third embodiments of the present invention.
Figure 25:
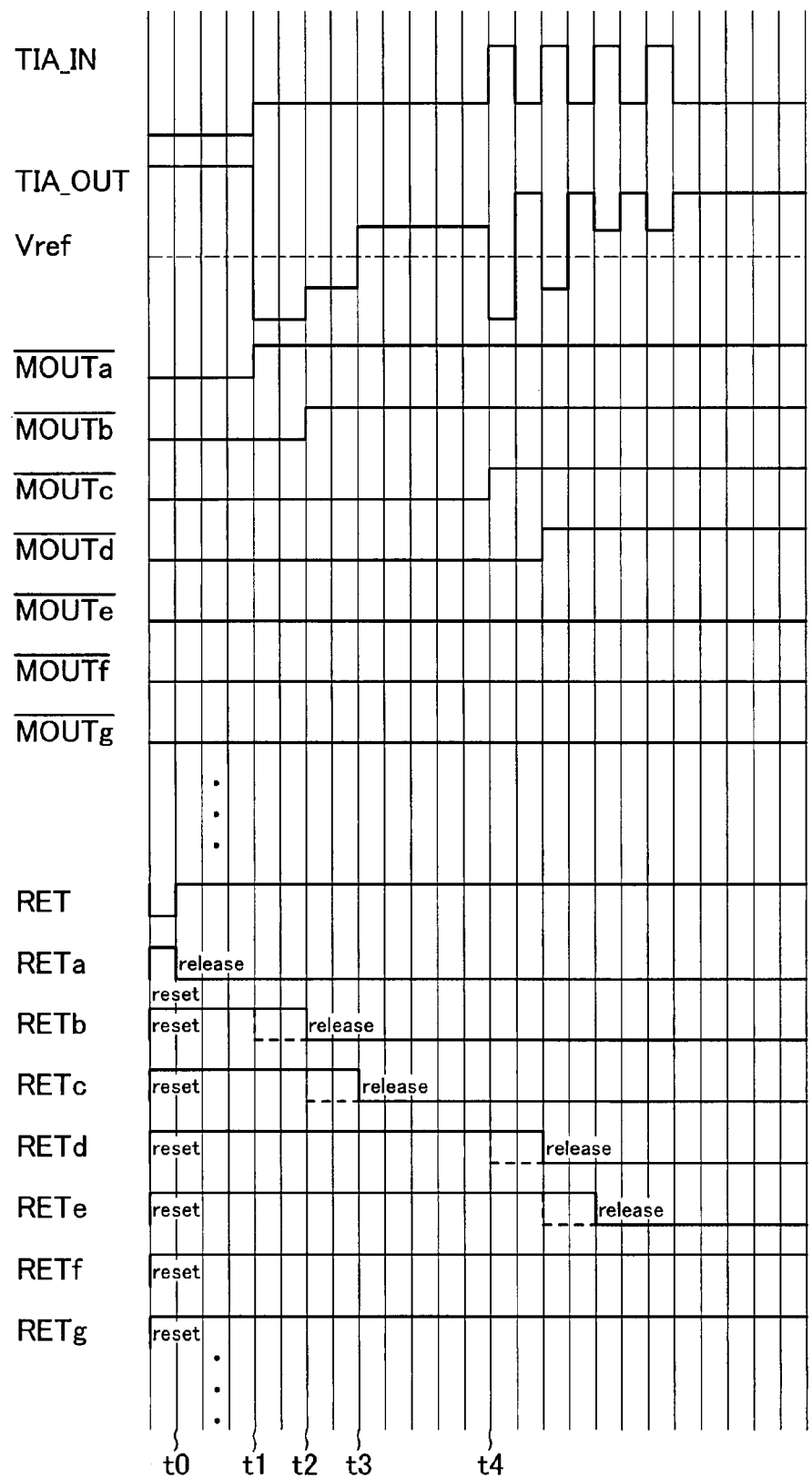
FIG. 25 is a timing chart of reset signals output by the control signal generating circuit of the first, second and third embodiments of the present invention.

FIG. 16 illustrates a specific example of the control signal generating circuit 10 in the control circuit. FIGS. 24 and 25 illustrate timing charts of the control signal generating circuit 10.

The control signal generating circuit 10 generates an AGC signal for adjusting the gain of the transimpedance amplifier 3 based on the external reset signal RET and the comparison results MOUTa, MOUTb, . . . output by the latch circuits 6a, 6b, . . . .

To generate the AGC signal, the control signal generating circuit 10 initially generates reverse-phase signals /MOUTa, /MOUTb, . . . of the comparison results MOUTa, MOUTb, . . . .

The thus-generated comparison results MOUTa, MOUTb, . . . and reverse-phase signals /MOUTa, /MOUTb, . . . , and the power supply voltage VDD are used to perform a two-input AND operation. Signals input to a two-input AND circuit are the generated comparison result and the reverse-phase signal of the previously generated comparison result. Specifically, for example, when the comparison result MOUTc is generated, the reverse-phase signal /MOUTb of the immediately previously generated comparison result and the comparison result MOUTc are input to the AND circuit (an AND circuit AND0b in FIG. 16). Similarly, AND operations of AND circuits AND0a to AND0z are performed with respect to the generated comparison results. Note that a logical addition with the power supply voltage VDD is operated with respect to the firstly generated comparison result MOUTa and the reverse-phase signal /MOUTz of the finally generated comparison result. Thus, an H signal is output from any one of the AND circuits AND0a to AND0z based on the comparison results successively generated.

On the other hand, set voltages Va, Vb, . . . , and Vz (Va<Vb< . . . <Vz) for controlling the gain of the transimpedance amplifier 3 are previously prepared, and are connected via respective switches SWa, SWb, . . . , and SWz to a line for supplying an AGC signal. These switches SWn (n represents a to z) are associated with the above-described AND circuits AND0n (n represents a to z). For example, when the output of the AND circuit AND0b is H, the switch SWb is switched ON, so that the set voltage Vb is output to the line for supplying the AGC signal.

Thus, the set voltages Va, Vb, . . . , and Vz are successively selected, depending on the output comparison results MOUTa, MOUTb, . . . , and are input as the AGC signal to the AGC signal input gate of the transimpedance amplifier 3 (e.g., FIG. 18), so that gain adjustment is performed.

Although the AND circuit is here used, any logic or analog circuit may be used as long as it is configured so that the set voltages Va, Vb, . . . , and Vz can be successively selected.

Although the set voltages Va, Vb, . . . , and Vz (Va<Vb< . . . <Vz) are set as the AGC signal, the relationship between the voltages is not limited to this.

Further, it has been assumed that when the output OUT of the transimpedance amplifier 3 is lower than the reference value VB1, the comparison result MOUTn which is the output of the comparison circuit 4 latched by the latch circuit 6n is L. Alternatively, the polarity may be reversed, depending on the configurations of the comparison circuit 4 and the latch circuit 6n. Note that n here represents a to z.

Also, although it has been here assumed that a single line outputs the AGC signal to the transimpedance amplifier 3, a plurality of AGC signals a, b, . . . may be generated and input to, for example, the transimpedance amplifier 3 of FIG. 19 so that gain adjustment is performed.

Also, although the set voltages Va, Vb, . . . , and Vz are here selected, instead of selecting the set voltages, a voltage having a logic level may be output, and input to the transimpedance amplifier 3 of, for example, FIGS. 20 and 21 so that the switch is switched ON/OFF to perform gain adjustment.

Further, control may be performed by directly utilizing the comparison results MOUTa, MOUTb, . . . .

The control signal generating circuit 10 of FIG. 16 further generates reset signals RETa, RETb, . . . which are input to the latch circuits 6a, 6b, . . . , based on the external reset signal RET and the comparison results MOUTa, MOUTb, . . . of the latch circuits 6a, 6b, . . . . In order to generate these reset signals RETa, RETb, . . . , the control signal generating circuit 10 comprises an inverter circuit INV2a and three-input NAND circuits NAND2b, NAND2c, . . . , and NAND2z.

Initially, the control signal generating circuit 10 generates the reverse-phase signals /MOUTa, /MOUTb, . . . of the comparison results MOUTa, MOUTb, . . . .

Here, the reset signal RETa is assumed to be the output of the inverter circuit INV2a, whose input terminal receives the externally input reset signal RET. Also, the reset signals RETb to RETz are assumed to be the outputs of the NAND circuits NAND2b to NAND2z, which receive the reset signal RET, the reverse-phase signals /MOUTa to /MOUTy, and the reverse-phase signals /MOUTa to /MOUTy via delay circuits Delaya to Delayy, respectively. For example, the reset signal RETc is generated by the NAND circuit NAND2c. If the reset signal RET externally input to the NAND circuit NAND2c is H and a delay time of Delayb elapses after H is input as the reverse-phase signal /MOUTb, then all inputs to the NAND circuit NAND2c go to H, and the reset signal RETc which is the output of the NAND circuit NAND2c goes to the L level. In the other cases, the NAND circuit NAND2c goes to the H level.

In this embodiment, while the reset signals RETa to RETz have the value H, the latch circuits 6a to 6z to which these are input are in the reset state. The reset is released when H→L.

Thus, the comparison results /MOUTa, /MOUTb, . . . are successively delayed to generate the reset signals RETa, RETB, . . . , which are in turn input to the latch circuits 6a, 6b, . . . , thereby successively releasing the reset of the latch circuits 6a, 6b, . . . , so that a latch operation is performed.

Here, the reset signal RET is added as one input signal to NAND so as to initially reset the reset signals RETb, RETc, . . . , and RETz.

Also, when the output OUT of the transimpedance amplifier 3 exceeds the reference value VB1, the comparison circuit 4 outputs L, so that the output /MOUTn of the latch circuit 6n continues to be L, and therefore, the new reset release of a latch circuit 6n+1 by a reset signal RETn+1 is stopped. When, thereby, the gain adjustment of the transimpedance amplifier 3 is no longer required, the subsequent latch circuit operation can be stopped, so that a useless circuit operation is removed, resulting in low power consumption.

Although it has been here assumed that, while the output value of the reset signal RETn is H, the latch circuit 6n is reset, and when H→L, the reset of the latch circuit 6n is released, the polarity may be reversed, depending on the configuration of the latch circuit 6n.

Here, an operation of the thus-configured control signal generating circuit 10 will be described with reference to the timing charts of FIGS. 24 and 25.

FIG. 24 is a diagram illustrating a variation in an output signal TIA_OUT with respect to an input signal TIA_IN of the transimpedance amplifier 3, in relation to the operations of the reverse-phase signals /MOUTa, /MOUTb, . . . , and /MOUTg and the switches SWa, SWb, . . . , and SWg. FIG. 25 is a diagram illustrating a variation in the output signal TIA_OUT with respect to the input signal TIA_IN of the transimpedance amplifier 3 which is the same as that of FIG. 24, in relation to the operations of the reverse-phase signals /MOUTa, /MOUTb, . . . , and /MOUTg and the operations the reset signals RET, RETa, RETb, . . . , and RETg. Note that, in FIGS. 24 and 25, TIA_IN represents the input signal of the transimpedance amplifier 3, TIA_OUT represents the output signal of the transimpedance amplifier 3, and Vref represents a comparative value which is compared with the output signal TIA_OUT in the comparison circuit 4.

In FIGS. 24 and 25, it is illustrated that the input signal TIA_IN is input to the transimpedance amplifier 3 at time t1.

Here, initially, as illustrated in FIG. 25, at time t0, the reset of the reset signal RETa of the latch circuit 6a is released, and the output signal TIA_OUT is higher than the comparative value Vref of the comparison circuit 4, so that the value of the comparison result MOUTa output by the latch circuit 6a is H (the value of the comparison result /MOUTa is L), and the AND circuit AND0a of the control signal generating circuit 10 of FIG. 16 outputs the value H. Thereby, as illustrated in FIG. 24, the switch SWa is selected, so that the set voltage Va is input as an AGC signal to the transimpedance amplifier 3.

At time t1, it is indicated that the output signal TIA_OUT with respect to the input signal TIA_IN at time t1 due to the gain of the transimpedance amplifier 3 set by the AGC signal of the set voltage Va falls below the comparative value Vref of the comparison circuit 4. Therefore, the comparison result MOUTa goes to L, i.e., the reverse-phase signal /MOUTa goes to H, so that the reset of the latch circuit 6b is released by the NAND circuit NAND2b of FIG. 16 after a predetermined delay elapses, and the new comparison result MOUTb is held by the latch circuit 6b. Thereby, the AND circuit AND0a of control signal generating circuit 10 of FIG. 16 goes to L, and the AND circuit AND0b goes to H, so that the switch SWb is selected, whereby the set voltage Vb is input to the transimpedance amplifier 3.

At time t2, the value of the output signal TIA_OUT newly output is slightly increased by the transimpedance amplifier 3 which has received the set voltage Vb and whose gain has been adjusted. However, the output signal TIA_OUT is still lower than the comparative value Vref, and therefore, the reset of the latch circuit 6c is released. Thereby, as is similar to that described above, the AND circuit AND0c of the control signal generating circuit 10 goes to H, so that the switch SWc is selected, whereby the set voltage Vc is input to the transimpedance amplifier 3.

At time t3, it is indicated that the output signal TIA_OUT exceeds the comparative value Vref due to the gain adjustment by the set voltage Vc. Thus, the gain of the transimpedance amplifier 3 is appropriately adjusted. In FIG. 24, the level of the input signal TIA_IN is not changed until time t4, so that the state is held until time t4.

However, at time t4, the level of the input signal TIA_IN is increased, and in response to this, the output signal TIA_OUT is also changed, so that the output signal TIA_OUT falls below the comparative value Vref again. Thereafter, as is similar to that described above, the gain adjustment is performed until the output signal TIA_OUT exceeds the comparative value Vref.

Second Embodiment

Next, a second embodiment of the receiving circuit of the present invention will be described with reference to FIG. 8.

The receiving circuit of this embodiment in which a register circuit is used to successively hold the comparison result of the comparison circuit 4, is different from that of the first embodiment in which the control circuit 5 of the receiving circuit uses the latch circuit to hold the comparison result of the comparison circuit 4.

Here, parts other than the register circuit have been described in the first embodiment, and therefore, the same parts will not be described.

Figure 8:
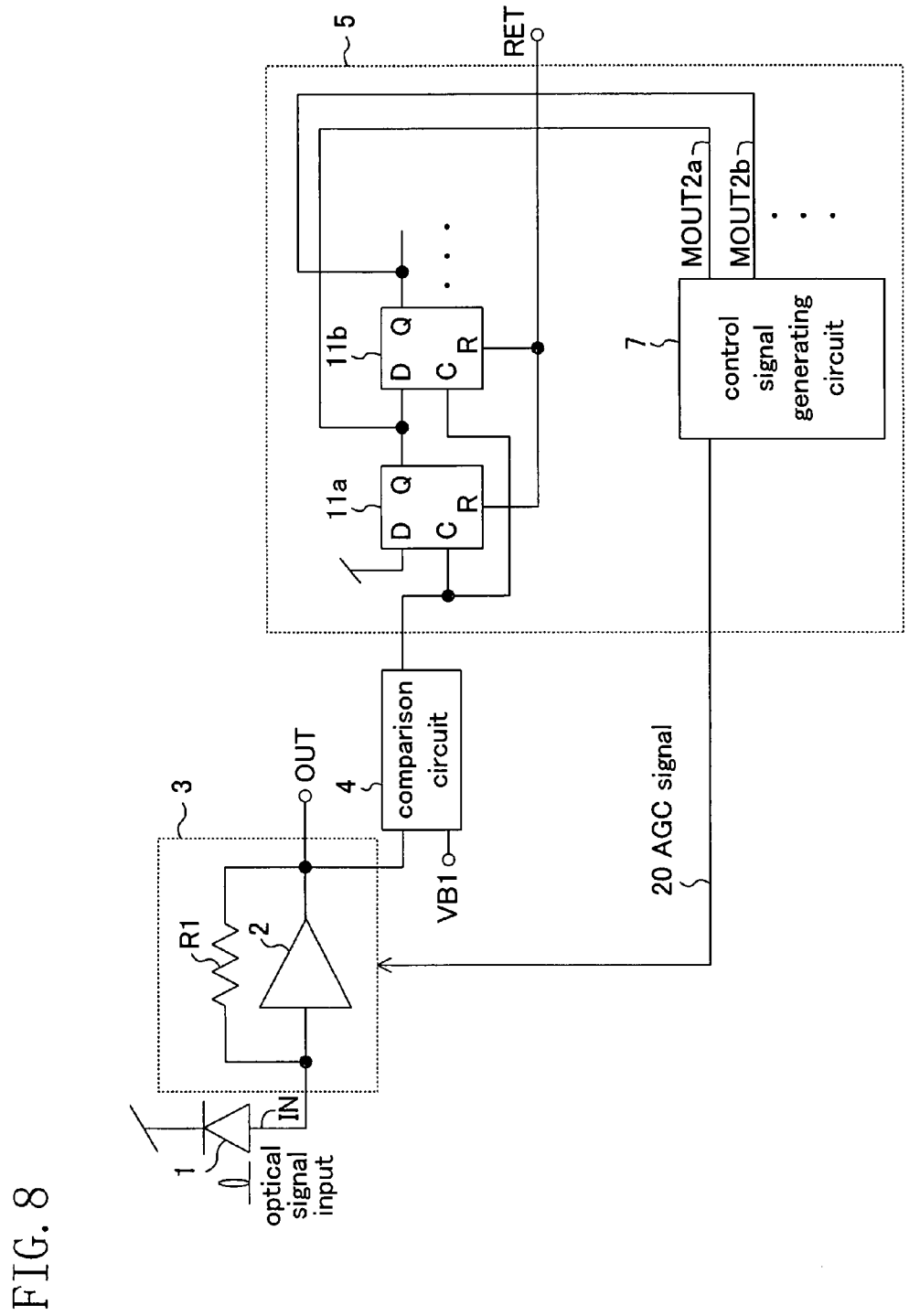
FIG. 8 is a block diagram of a light receiving circuit according to a second embodiment of the present invention.

A control circuit 5 included in the receiving circuit of this embodiment of FIG. 8 comprises: shift register circuits 11a, 11b, . . . for successively holding a comparison result output from a comparison circuit 4; and a control signal generating circuit 7 for generating an AGC signal 20 which is a control signal for adjusting the gain of a transimpedance amplifier 3 based on output results MOUTa, MOUTb, . . . of the shift register circuits 11a, 11b, . . . .

Here, an operation of the thus-configured control circuit 5 will be described. In the control circuit 5, initially, a reset signal RET is input to the shift register circuits 11a, 11b, . . . , which are in turn initialized.

Next, if the reset signal RET of the shift register circuit 11a, 11b, . . . is disabled, then a value H is output as a comparison result MOUT2a from the shift register circuit 11a, and as a result, the control signal generating circuit 7 outputs the AGC signal 20 for adjusting the gain of the transimpedance amplifier 3, and the transimpedance amplifier 3 outputs a signal amplified by the adjusted gain. Next, with the adjusted gain, when the output signal of the transimpedance amplifier 3 is still lower than the reference value VB1, the shift register circuits 11a and 11b output the value H as the comparison results MOUT2a and MOUT2b, and as a result, the control signal generating circuit 7 outputs the AGC signal 20 for adjusting the gain of the transimpedance amplifier 3, and the transimpedance amplifier 3 outputs a signal amplified by the adjusted gain.

Thereafter, as long as the output signal of the transimpedance amplifier 3 is lower than the reference value VB1, the shift register is operated, continuing to adjust the gain of the transimpedance amplifier 3. Thereafter, when the output signal of the transimpedance amplifier 3 exceeds the reference value VB1, the changing of the shift register is stopped, and thereafter, the gain corresponding to the output of the appropriate shift register set at that time (corresponding to the AGC signal) continues to be held.

In this apparatus, it is not necessary to produce a complicated reset signal, and a response can be produced every time an H-level signal is input, thereby making it possible to achieve a high-speed response.

Also, as is similar to the first embodiment, by applying the reset signal RET to the control circuit 5, a discontinuous signal, such as a burst signal or the like, can be addressed.

It has been here explicitly described that, when the output signal OUT is lower than the reference value VB1, the comparison circuit 4 outputs the value H to the comparison result MOUTn. Alternatively, for example, the reference value VB1 may be set or the comparison circuit 4 may be configured so that the value L is output.

Further, it has been here explicitly described that the control signal generating circuit 7 outputs the AGC signal 20 for adjusting the gain of the transimpedance amplifier 3. Alternatively, the output results MOUTa, MOUTb, . . . may be directly used as control signals.

Third Embodiment

Next, a third embodiment of the receiving circuit of the present invention will be described with reference to FIG. 9.

Figure 9:
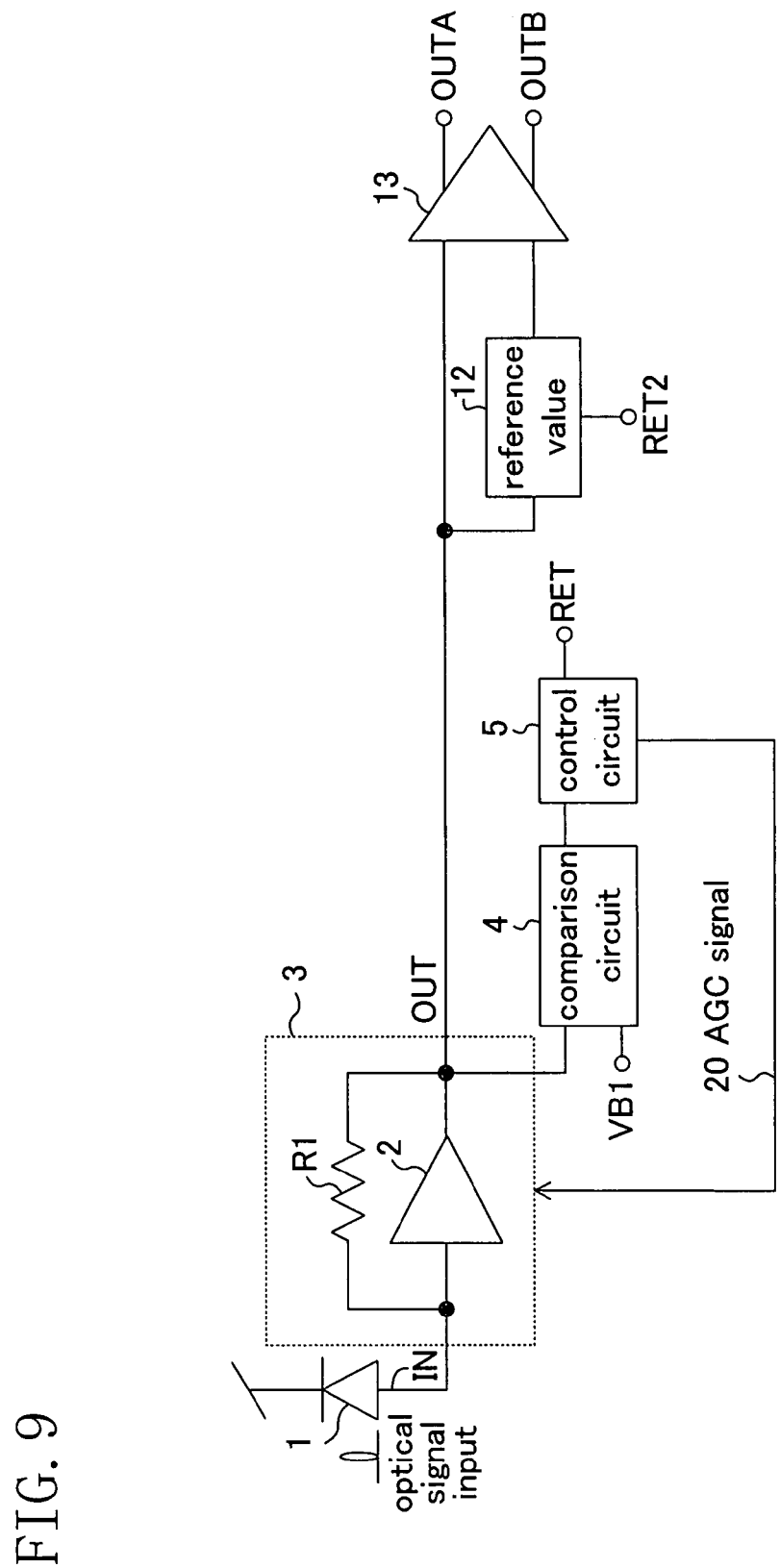
FIG. 9 is a block diagram of a light receiving circuit according to a third embodiment of the present invention.

The receiving circuit of this embodiment of FIG. 9 is different from that of the first embodiment in that a reference value generating circuit 12 for generating an intermediate value of the output of the transimpedance amplifier 3, and a differential amplification circuit 13 for receiving the output of the transimpedance amplifier and the output of the reference value generating circuit 12 to generate a differential signal, are further provided.

When a differential signal is required in a subsequent amplifier circuit (e.g., in data communication, etc.), since the output signal OUT is a single signal in the configuration of the first embodiment of the present invention, single-differential conversion as described in the present invention is required.

Also, the reference value generating circuit 12 can be initialized by inputting a reset signal (intermediate value reset signal) with any timing, thereby making it possible to provide a response to a discontinuous signal, such as a burst signal or the like.

Also, the reference value generating circuit 12 may detect a minimum value and a maximum value of the output of the transimpedance amplifier 3 to obtain an intermediate value, or may obtain an intermediate value directly, or may have any configuration which can generate an intermediate value.

Here, parts other than the above-described configuration have been described in the first embodiment, and therefore, the same parts will not be described.

Figure 10:
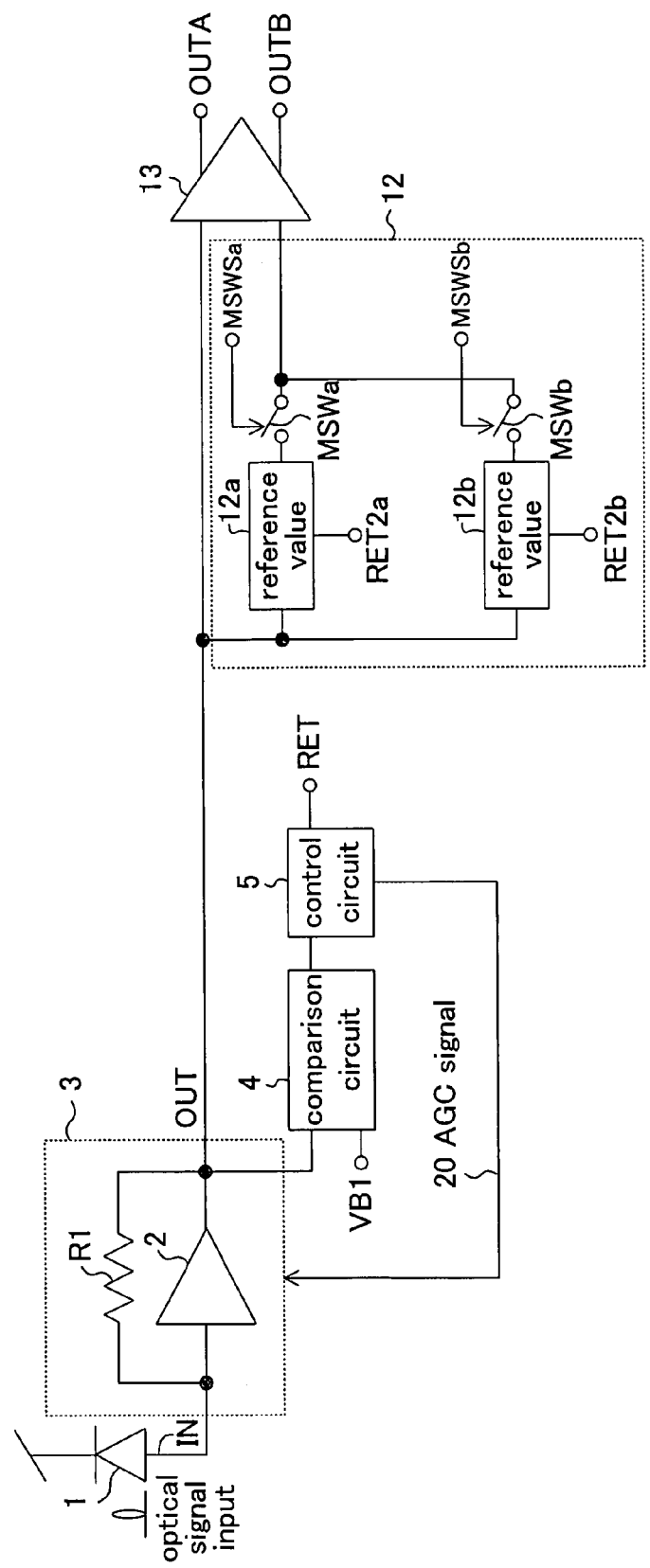
FIG. 10 is a block diagram of the light receiving circuit illustrating a specific example A of a reference value generating circuit in the third embodiment of the present invention.

FIG. 10 illustrates a specific example of the reference value generating circuit 12 of the receiving circuit of this embodiment.

The reference value generating circuit 12 comprises: two or more reference value generating circuits (intermediate value generating circuits) 12a, 12b, . . . connected in parallel to the output OUT of the transimpedance amplifier 3; and switches (intermediate value selecting switches) MSWa, MSWb, . . . connected in series to the reference value generating circuits 12a, 12b, . . . and for selecting respective outputs thereof. The differential amplification circuit 13 receives the output of the transimpedance amplifier 3 and the output of the reference value generating circuit 12 to output differential outputs (differential signals) OUTA and OUTB.

Here, an operation of the thus-configuration reference value generating circuit 12 will be described. Reset signals (intermediate value reset signals) RET2a, RET2b, . . . for initialization are initially input to the respective reference value generating circuits 12a, 12b, . . . to initialize intermediate values possessed by the circuits 12a, 12b, . . . . Next, when the output signal OUT of the transimpedance amplifier 3 is input, the reset signal RET2a is initially disabled so that the reference value generating circuit 12*a* is operated, and a select signal MSWSa is input to the switch MSWa connected in series to the reference value generating circuit 12*a* so that the switch MSWa is switched ON, whereby the output of the reference value generating circuit 12*a* is connected to the differential amplification circuit 13. In this case, the reference value generating circuits 12*b*, . . . other than the reference value generating circuit 12*a* are reset so that select signals MSWSb, . . . for switching OFF the switches MSWb, . . . connected in series to the reference value generating circuits 12*b*, . . . are input, whereby the connection with the differential amplification circuit 13 is cut.

Next, when the gain of the transimpedance amplifier 3 changes, the output amplitude changes. Therefore, in order to generate an accurate intermediate value after the change, the reference value generating circuit 12*b* is assumed to be newly used. To do so, the reset signal RET2*b* is disabled so that the reference value generating circuit 12*b* is operated, and the select signal MSWSb for switching ON is input to the switch MSWb connected in series to the reference value generating circuit 12*b*, whereby the output of the reference value generating circuit 12*b* is connected to the differential amplification circuit 13. In this case, the reset RET2*a* is input again to the reference value generating circuit 12*a*, and the select signal MSWSa for switching OFF is input to the switch MSWa connected in series to the reference value generating circuit 12*a*, whereby the connection is cut.

Thus, by switching the two or more reference value generating circuits 12*a*, 12*b*, . . . as required, an appropriate reference value can be invariably generated as required.

As a method of switching by the reference value generating circuit 12, the two reference value generating circuits 12*a* and 12*b* may be alternately used. Particularly, the method of alternately using the reference value generating circuits 12*a* and 12*b* is a considerably effective reference value generating technique which has a small number of parts and can invariably generate an accurate reference value.

Also, when the gain of the transimpedance amplifier 3 is largely adjusted only at an initial stage, the reference value generating circuits 12*a*, 12*b*, . . . may be switched in a manner such that the reference value generating circuit 12*a* is used only at the initial stage, and thereafter, the reference value generating circuits 12*b*, . . . are successively or alternatively used.

Although it has been explicitly described that the select signals MSWSa, MSWSb, . . . are switched when the gain of the transimpedance amplifier 3 is changed, the present invention is not limited to this timing. Any timing with may be used as long as an appropriate reference value can be generated.

Next, a specific example of a control circuit 14 in the receiving circuit of this embodiment will be described with reference to FIGS. 11 and 12.

Figure 11:
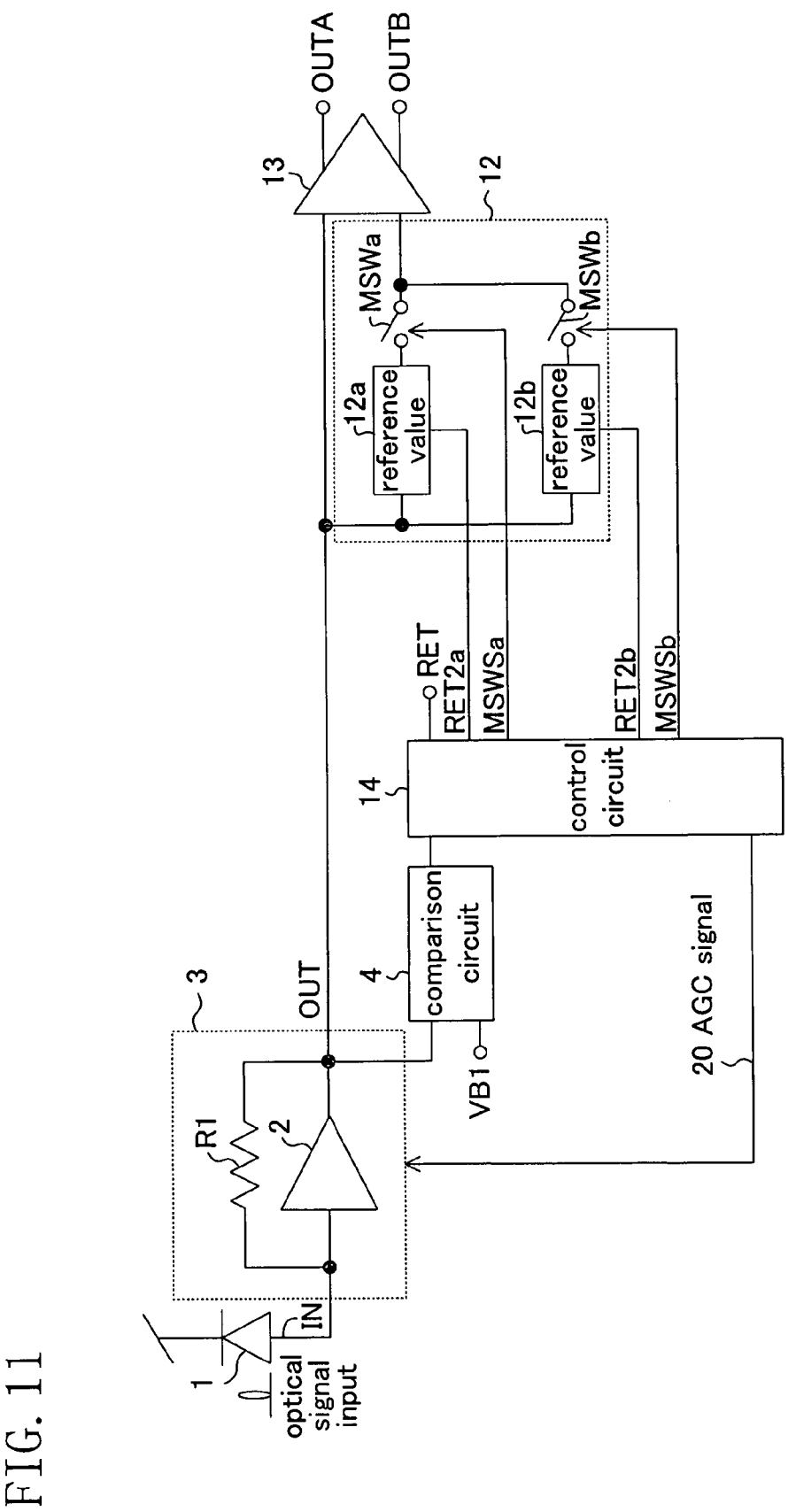
FIG. 11 is a block diagram of the light receiving circuit illustrating a specific example B of a reference value generating circuit in the third embodiment of the present invention.
Figure 12:
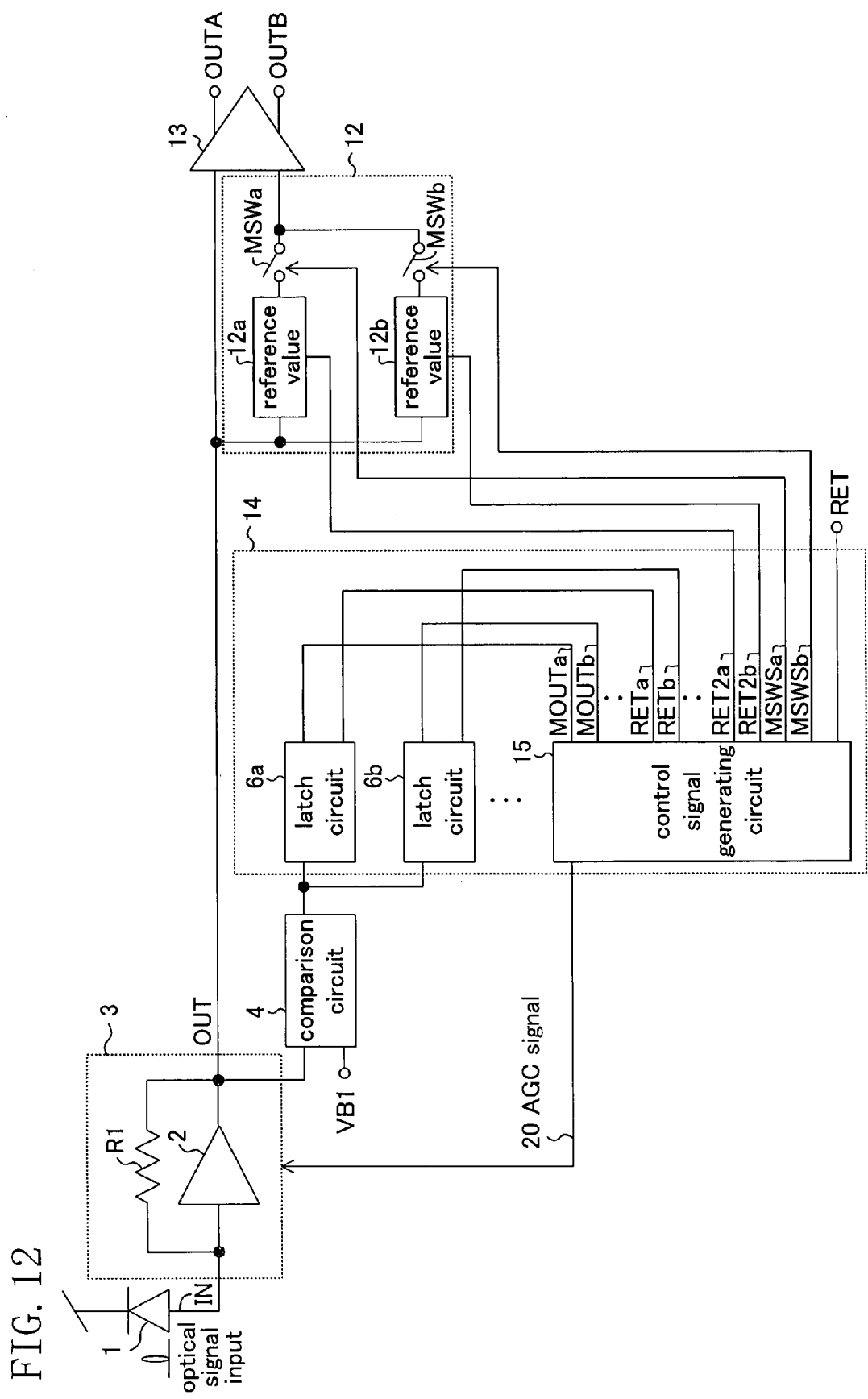
FIG. 12 is a block diagram of the light receiving circuit illustrating a specific example C of a reference value generating circuit in the third embodiment of the present invention.

The control circuit 14 in the receiving circuit of FIG. 11 outputs reset signals RET2*a*, RET2*b*, . . . for resetting reference values of the reference value generating circuits (intermediate value generating circuits) 12*a*, 12*b*, . . . included in the reference value generating circuit 12, and signals for switching ON/OFF the switches (intermediate value selecting switches) MSWSa, MSWSb, . . . for connecting the reference value generating circuits 12*a*, 12*b*, . . . to the differential amplification circuit 13, based on the comparison result of the comparison circuit 4 and the reset signal RET. A configuration of the control circuit 14 will be described in detail with reference to FIG. 12.

The control circuit 14 comprises: a plurality of latch circuits 6*a*, 6*b*, . . . ; and a control signal generating circuit 15 for generating, based on an external reset signal RET and comparison results MOUTa, MOUTb, . . . of the latch circuits 6*a*, 6*b*, . . . , an AGC signal 20 for adjusting the gain of the transimpedance amplifier 3, reset signals (held-value resetting signals) RETa, RETb, . . . to be input to the respective latch circuits 6*a*, 6*b*, . . . , reset signals (intermediate value reset signals) RET2*a*, RET2*b*, . . . to be input to the respective reference value generating circuits 12*a*, 12*b*, . . . , and select signals (intermediate value selecting switch ON/OFF signals) MSWSa, MSWSb, . . . to be input to the respective switches MSWa, MSWb, . . . for selecting the outputs of the reference value generating circuits 12*a*, 12*b*, . . . .

Here, an operation of the thus-configured the control circuit 14 will be described. The control signal generating circuit 15 of the control circuit 14 initializes the latch circuits 6*a*, 6*b*, . . . using the reset signals RETa, RETb, . . . based on the external reset signal RET. Also, the control signal generating circuit 15 initializes the reference value generating circuit 12*a*, 12*b* . . . using the reset signals RET2*a*, RET2*b*, . . . .

Next, the control signal generating circuit 15 inputs the reset signal RETa which has been switched to a signal for releasing the reset of the latch circuit 6*a* to the latch circuit 6*a*, which is in turn changed to an operating state in which the output of the comparison circuit is held. Similarly, the control signal generating circuit 15 disables the reset signal RET2*a* of the reference value generating circuit 12*a* to operate the reference value generating circuit 12*a*, and switches ON the select signal MSWSa to the switch MSWa which selects the output, thereby inputting a reference value generated in the reference value generating circuit 12*a* to the differential amplification circuit 13. Note that the reset signals RET2*b*, . . . of the reference value generating circuits 12*b*, . . . other than the reference value generating circuit 12*a* remain reset, and the select signals MSWSb, . . . to the switches MSWb, . . . for selecting the outputs of the reference value generating circuits 12*b*, . . . are OFF.

Next, when the latch circuit 6*a* holds the comparison result of the comparison circuit 4, and the comparison result MOUTa is output, the AGC signal 20 for gain adjustment is output to the transimpedance amplifier 3, so that the transimpedance amplifier 3 amplifies an input current using the newly set gain. In the reference value generating circuit 12*b*, in order to generate an accurate intermediate value using the newly set gain of the transimpedance amplifier 3, the reset signal RET2*b* is disabled so that the reference value generating circuit 12*b* is operated, and the select signal MSWSb to the switch MSWb for selecting the output is switched ON. Also in this case, the reference value generating circuit 12*a* is reset again using the reset signal RET2*a*, and the select signal MSWSa to the switch MSWa which selects the output of the reference value generating circuit 12*a* is caused to be OFF, thereby cutting the connection. Note that the reset signals RET2*c*, . . . of the reference value generating circuits 12*c*, . . . remain reset, and the select signals MSWSc, . . . to the switches MSWc, . . . which select the outputs of the reference value generating circuits 12*c*, . . . are OFF. Further, in the latch circuit 6*b*, in order to hold the comparison result obtained with the newly set gain of the transimpedance amplifier 3, the reset signal RETb for releasing the reset of the latch circuit 6*b* is input, thereby holding the comparison result.

Here, the reset signal RETb is generated with timing slight delayed from the comparison result MOUTa of the latch circuit 6*a* so as not to be affected by a variation during the gain adjustment of the transimpedance amplifier 3. Also, the reset signals RET2*a*, RET2*b*, . . . and the select signals MSWSa, MSWSb, . . . are generated with timing slightly delayed from the comparison result MOUTa of the latch circuit 6a so as not to be affected by a variation during the gain adjustment of the transimpedance amplifier 3.

Thus, in this configuration, the reset signals RETa, RETb, . . . , the reset signals RET2a, RET2b, . . . , and the select signals MSWSa, MSWSb, . . . are generated based on the comparison results MOUTa, MOUTb, . . . , thereby making it possible to hold a comparison result with high precision, control the gain of the transimpedance amplifier 3, and generate the accurate intermediate value of the transimpedance amplifier 3.

Also, even when the gain adjustment of the transimpedance amplifier 3 is no longer required, i.e., the value of the output OUT of the transimpedance amplifier 3 exceeds the reference value VB1 in the comparison circuit 4, it is possible to stop the generation of new reset signals RETa, RETb, . . . without a stop signal. Therefore, a useless circuit operation or latch operation is not required, resulting in low power consumption.

Note that it has been here assumed that the reset signal RETb is generated with timing slightly delayed from the comparison result MOUTa of the latch circuit 6a. The delayed timing may be generated using a delay circuit or any other configurations.

Also, it has been assumed that the reset signals RET2a, RET2b, . . . and the select signals MSWSa, MSWSb, . . . are generated with timing slightly delayed from the comparison result MOUTa of the latch circuit 6a. The delayed timing may be generated using a delay circuit, gate delay, or any other configurations.

Further, it has been described that the above-described configuration includes the reference value generating circuits 12a, 12b, . . . . The reference value generating circuits may be successively used, or two or a plurality of reference value generating circuits may be alternately used. Any method of using the reference value generating circuits may be adopted as long as it can generate a high-precision reference value.

Also, the description has been here given based on the comparison results MOUTa, MOUTb, . . . of the latch circuits 6a, 6b, . . . . Instead of these, the shift register circuits 11a, 11b, . . . for holding the comparison results MOUTa, MOUTb, . . . may be used to generate the AGC signal 20 for adjusting the gain of the transimpedance amplifier 3, the reset signals RETa, RETb, . . . for resetting the shift register circuits 11a, 11b, . . . , the reset signals RET2a, RET2b, . . . for resetting the reference values of the reference value generating circuits 12a, 12b, . . . , and the select signals MSWSa, MSWSb, . . . . Other configurations for holding the comparison result of the comparison circuit may be used.

Figure 17:
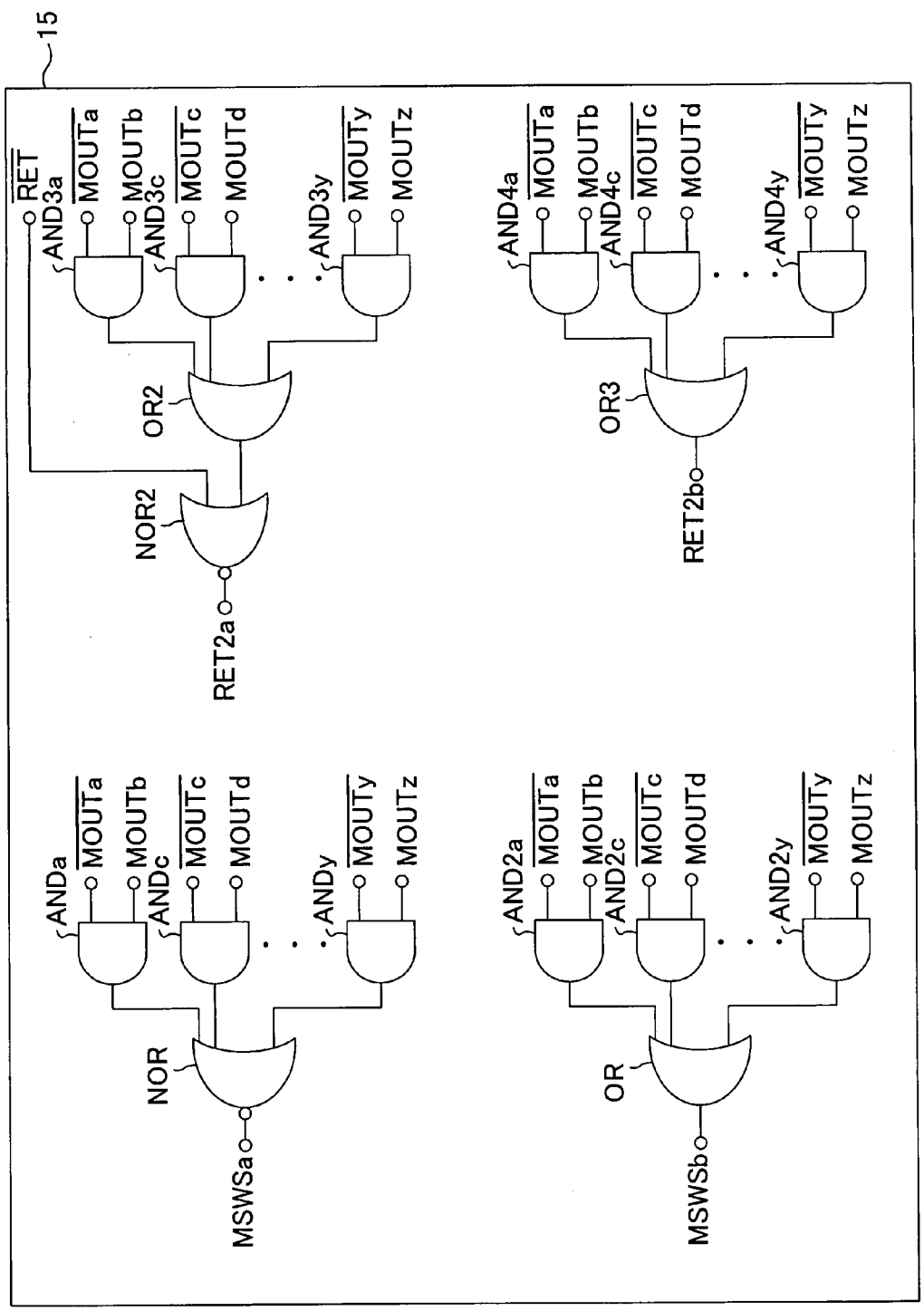
FIG. 17 is a circuit diagram of a control signal generating circuit according to the third embodiment of the present invention.
Figure 26:
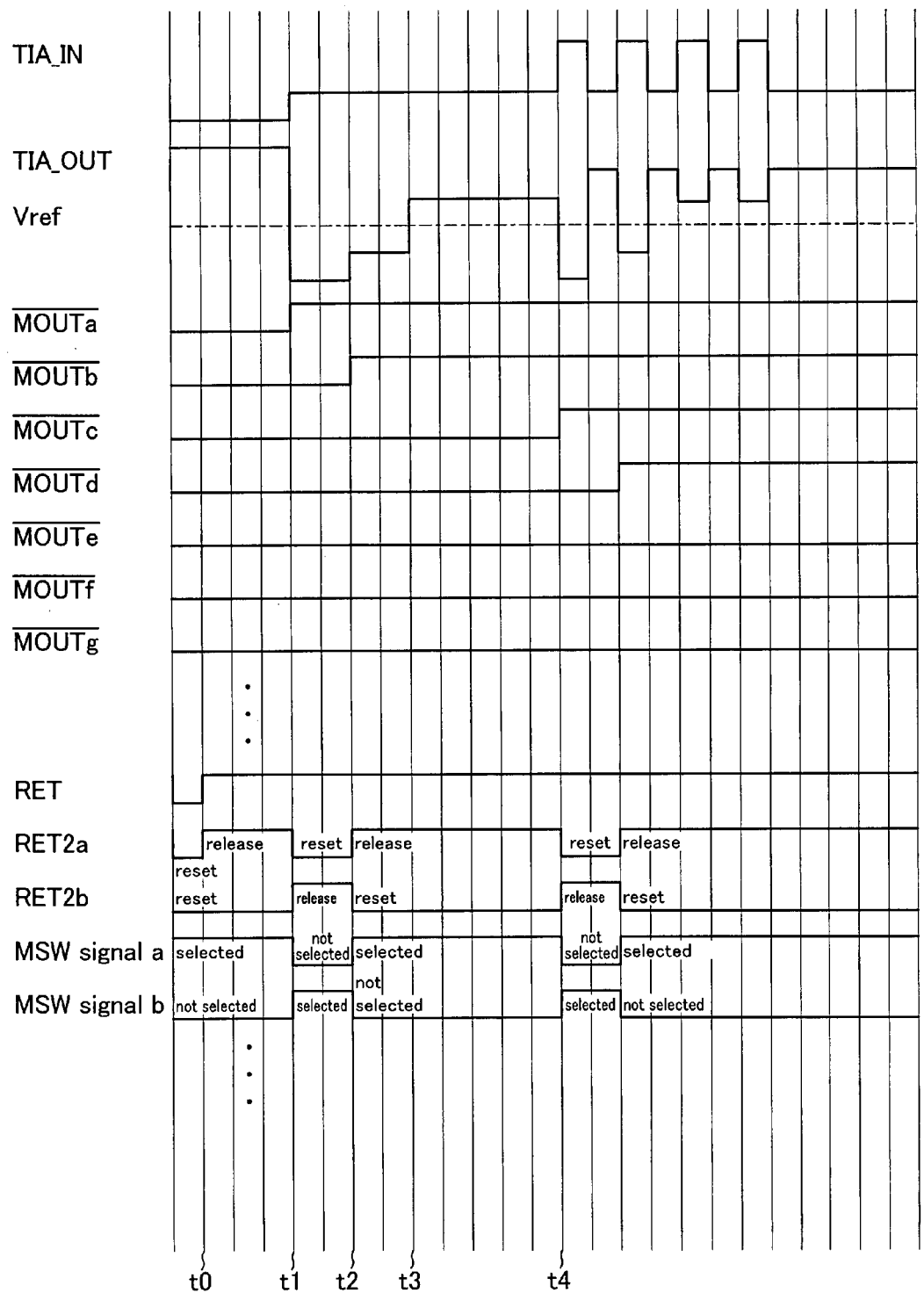
FIG. 26 is a timing chart of reset signals output by the control signal generating circuit of the present invention and select switches.

Hereinafter, FIG. 17 illustrates a specific example of the control signal generating circuit 15, and FIGS. 24 and 26 illustrate timing charts of the control signal generating circuit 15.

The circuit of FIG. 17 generates the reset signals RET2a and RET2b to the reference value generating circuits 12a and 12b and the select signals MSWSa and MSWSb based on the external reset signal RET and the comparison results MOUTa, MOUTb, . . . of the latch circuits 6a, 6b, . . . .

The control signal generating circuit 15 has a configuration obtained by adding the circuit of FIG. 17 to the control signal generating circuit 10 of FIG. 16.

Initially, the reverse-phase signals /MOUTa, /MOUTb, . . . of the comparison results MOUTa, MOUTb, . . . are generated. Next, AND of the comparison results MOUTn and its reverse-phase signal /MOUTn is calculated by the AND circuit ANDn. Note that n here represents a, b, c, . . . , and z. Next, the result of the AND is subjected to an NOR operation by a NOR circuit NOR, whose output is used as the select signal MSWSa for selecting the switch MSWa.

Also, the reverse-phase signal /MOUTn and the comparison result MOUTn are subjected to an AND operation by an AND circuit AND2n. Following this, the results of these AND operations are subjected to an OR operation by an OR circuit OR, whose output is used as the select signal MSWSb for selecting the switch MSWb.

Also, a circuit having the same configuration as that of the circuit for generating the select signal MSWSb is composed of an OR circuit OR2 and AND circuits AND3a, AND3c, . . . , and AND3y. A NOR circuit NOR2 for operating a negation of the logical addition of the output of the OR circuit OR2 and the inverted signal /RET of the reset signal RET is added to the circuit. An output of the resultant circuit is used as the reset signal RET2a. Further, a circuit having the same configuration as that of the circuit for generating the select signal MSWSb is composed of an OR circuit OR3 and AND circuits AND4a, AND4c, . . . , and AND4y, and the output is used as the reset signal RET2b.

The thus-obtained select signal MSWSa is input to the switch MSWa connected to the reference value generating circuit 12a, and the select signal MSWSb is input to the switch MSWb connected to the reference value generating circuit 12b.

The thus-configured control circuit 14 of FIG. 12 operates as follows. Referring to FIG. 26, when the output signal TIA_OUT of the transimpedance amplifier 3 is higher than the comparative value Vref, and in an initial state before time t0, i.e., in a state in which the control signal generating circuit 15 of FIG. 12 is reset, all the outputs of the AND circuits AND3a to AND3y which receive the reverse-phase signal /MOUTa, /MOUT c, . . . , and /MOUTy of the comparison results and the comparison results MOUTb, MOUTd, . . . , and MOUTz are L in a circuit for generating the reset signal RET2a of the control signal generating circuit 15 of FIG. 17. Thereby, the output of the OR circuit OR2 goes to L. Therefore, the inverted value H of the reset signal RET and the output value L of the OR circuit OR2 are input to the NOR circuit NOR2, whose output value, i.e., the value of the reset signal RET2a, goes to L. On the other hand, in a circuit which generates the select signal MSWSa, all the outputs of AND circuits ANDa to ANDy go to L, so that the output (i.e., the select signal MSWSa) of the NOR circuit NOR is H, and therefore, the switch MSWa is selected. In this state, at time t0, the reset RET goes to H, and the reset of the control signal generating circuit 15 of FIG. 12 is released, so that both two inputs to the NOR circuit NOR2 go to L, and therefore, the value of the output (i.e., the reset signal RET2a) goes to H. Also, the select signal MSWSa is not changed, and therefore, an output value which is differentially amplified using a reference value generated by the selected reference value generating circuit 12a is obtained from the differential amplification circuit 13.

At time t1, the output signal TIA_OUT falls below the comparative value Vref, so that the output MOUTa of the latch circuit 6a goes to L (the value of the reverse-phase signal /MOUTa is H). Therefore, the output of the AND circuit AND3a goes to H, and further, the output of the OR circuit OR2 goes to H, so that the output (i.e., the reset signal RET2a) of the NOR circuit NOR2 goes to L, i.e., the reset state. At the same time, as in the AND circuit AND3a, the outputs of the AND circuits ANDa, AND2a, and AND4a go to H, so that the select signal MSWSa is not selected, the select signal MSWSb is selected, and the reset signal RET2b goes to the reset state. Therefore, the differential amplification circuit 13 uses a reference value generated by the reference value generating circuit 12b.

At time t2, since the output signal TIA_OUT is still higher than the comparative value Vref, the output MOUTb of the latch circuit 6b goes to L (the value of the reverse-phase signal /MOUTb is H). Therefore, all the outputs of the AND circuits ANDa, AND2a, AND3a, and AND4a go to L, so that the select signal MSWSa is selected, the select signal MSWSb is not selected, the reset signal RET2a is disabled, and the reset signal RET2b goes to the reset state.

Next, at time t3, the output signal TIA_OUT exceeds the comparative value Vref, and the gain of the transimpedance amplifier 3 is appropriately adjusted, whereby the output value of the latch circuit is held at the same value as that at time t2. Therefore, the states of the select signals MSWSa and MSWSb and the reset signals RET2a and RET2b are the same as those at time t2.

This state is held until the output signal TIA_OUT falls below the comparative value Vref again at time t4. At and after time t4, switching operations indicated at times t1 to t3 are performed, depending on the relationship between the output signal TIA_OUT and the comparative value Vref.

With the above-described configuration, the select signal MSWSa and the select signal MSWSb have phases reverse to each other, and therefore, the reference value generating circuits 12a and 12b are alternately used, depending on the outputs of the comparison results MOUTa, MOUTb, . . . .

Note that it has been here assumed that the two reference value generating circuits 12a and 12b are alternately used. Alternatively, when a plurality of reference value, generating circuits 12a, 12b, . . . are used, select signals may be successively generated.

Also, it has been explicitly described that the reference value generating circuits 12a and 12b are reset, depending on the outputs of the comparison results MOUTa, MOUTb, . . . . Any timing may be used as long as an appropriate intermediate value can be provided.

In this embodiment, the circuit for generating the reset signals RET2a and RET2b of FIG. 17 has a configuration similar to that for the select signals MSWSa and MSWSb. The present invention is not limited to this as long as the same timing signal can be produced.

Note that the configurations of FIGS. 16 and 17 are illustrated as exemplary configurations of the control circuits 7, 9, 10 and 15. Any configuration may be used as long as, based on the external reset signal RET and the comparison results MOUTa, MOUTb, . . . of the latch circuits 6a, 6b, . . . , the AGC signal 20 for adjusting the gain of the transimpedance amplifier 3 is generated, the reset signals RETa, RETb, . . . to be input to the respective latch circuits 6a, 6b, . . . , the reset signals RET2a, RET2b, . . . to be input to the respective reference value generating circuits 12a, 12b, . . . , and the select signals MSWSa, MSWSb, . . . to the switches MSWa, MSWb, . . . for selecting the outputs.

Fourth Embodiment

Next, a fourth embodiment of the receiving circuit of the present invention will be described with reference to FIG. 13.

Figure 13:
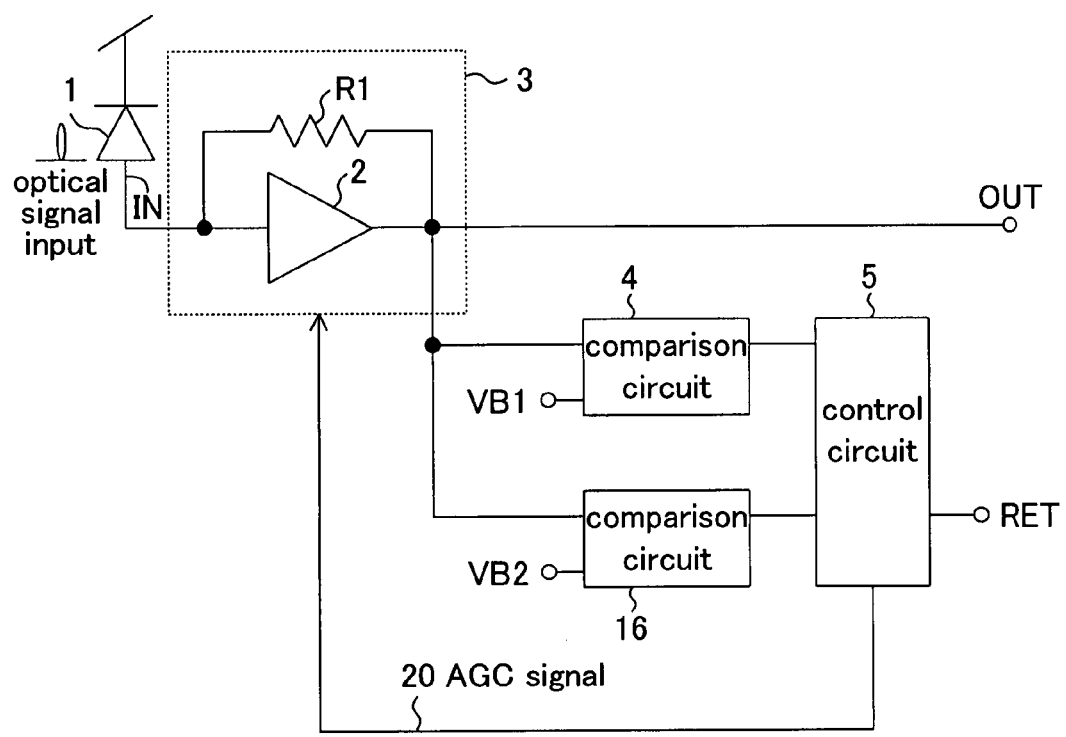
FIG. 13 is a block diagram of a light receiving circuit according to a fourth embodiment of the present invention.

In the receiving circuit of this embodiment of FIG. 13, a comparison circuit (second comparison circuit) 16 for comparing a certain desired reference value (second comparative value) VB2 and the output of the transimpedance amplifier 3 and outputting the comparison result, is added in parallel to the comparison circuit 4 (first comparison circuit) in the configuration of the first embodiment of the present invention, and based on the comparison results of the comparison circuits 4 and 6, the control circuit 5 outputs an AGC signal 20 for adjusting the gain of the transimpedance amplifier 3.

Here, parts other than the above-described configuration have been described in the first embodiment, and therefore, the same parts will not be described.

Here, the above-described configuration will be described. The transimpedance amplifier 3 amplifies an input current and outputs the result. The comparison circuit 4 compares the output signal OUT of the transimpedance amplifier 3 and the adjusted gain and the reference value (first comparative value) VB1 set to have a certain desired value, and when the output signal OUT is lower than the reference value VB1, outputs a signal indicating that the output signal OUT is lower than the reference value VB1. The control circuit 5 holds the comparison signal, and outputs a control signal for adjusting the gain of the transimpedance amplifier 3. Thereby, the transimpedance amplifier 3 amplifies an input current using the gain adjusted in accordance with the control signal, and outputs the result. Further, the comparison circuit 4 compares the output signal OUT of the transimpedance amplifier 3 with the adjusted gain and the reference value VB1 set to have the certain desired value, and when the output signal OUT is lower than the reference value VB1, outputs a signal that the output signal OUT is lower than the reference value VB1. Thus, the comparison circuit 4 continues comparison, and the control circuit 5 continues to output a control signal, so that the gain of the transimpedance amplifier 3 continues to be adjusted, until the output signal of the transimpedance amplifier 3 exceeds the reference value VB1.

However, in this method, when the gain of the transimpedance amplifier 3 is changed, the output amplitude may be suddenly excessively reduced. Therefore, further in the present invention, the comparison circuit 16 compares the output signal OUT of the transimpedance amplifier 3 and the adjusted gain and a reference value VB2 set to have a certain desired value, and outputs the comparison result. According to the result, when the output signal of the transimpedance amplifier 3 is higher than the reference value VB2, it is considered that the gain adjustment of the output OUT of the transimpedance amplifier 3 is excessive, so that a change in the output amplitude of the transimpedance amplifier 3 before and after the gain adjustment is excessively large. Therefore, to reduce the gain, the control circuit 5 outputs the AGC signal 20 for gain adjustment to the transimpedance amplifier 3 to adjust the gain of the transimpedance amplifier 3 to be increased.

Note that the comparison circuit 4 and the comparison circuit 16 used in this case may have the same configuration or different configurations.

Figure 23:
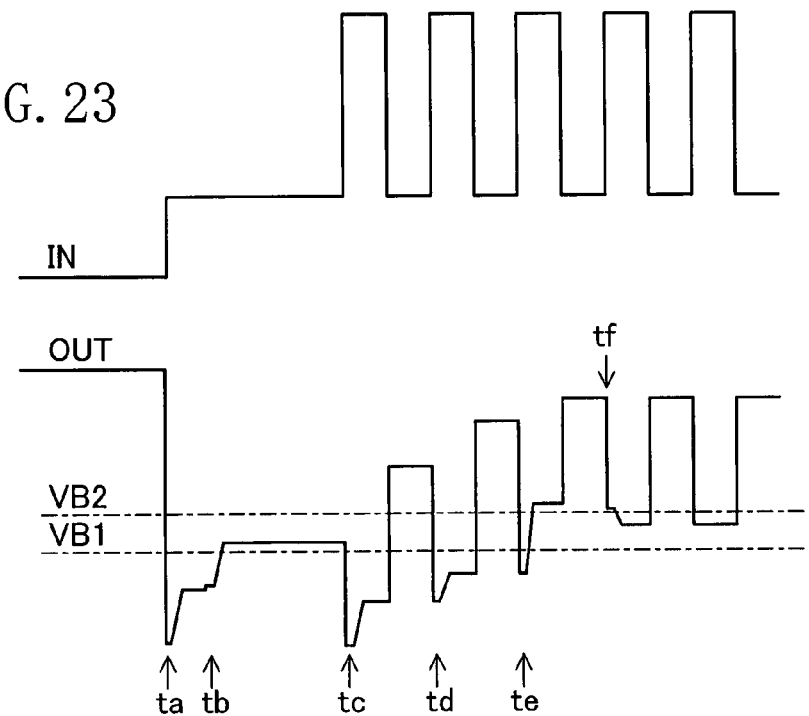
FIG. 23 is a timing chart of input and output signals of a transimpedance amplifier according to the fourth embodiment of the present invention.

FIG. 23 illustrates a timing chart of the input signal IN of the transimpedance amplifier 3, the output signal OUT of the transimpedance amplifier 3, and an comparison operation with the predetermined reference voltages VB1 and VB2 previously set. During times ta to te when the output signal OUT is lower than the reference voltage VB1, the amplitude of the output signal OUT is adjusted to be small so that the gain of the transimpedance amplifier 3 is small. When the amount of gain adjustment is excessively large, so that the output signal OUT exceeds the reference voltage VB2, the gain of the transimpedance amplifier 3 is increased so that the amplitude of the output signal OUT is corrected to be increased (time tf). The adjustment is continued until the output signal OUT of the transimpedance amplifier 3 falls between the reference voltages VB1 and VB2.

Also, in this figure, the AGC function is operated every time data is at the H level. The AGC function may be operated with any timing.

Further, in this embodiment, as in the first embodiment, by applying the reset signal RET to the control circuit 5, a discontinuous signal, such as a burst signal or the like, can be addressed.

Although it has been described in the first to fourth embodiments that the input signal is an optical input, the present invention is not limited to this. The present invention may be similarly applied to an input signal which is an electric current.

INDUSTRIAL APPLICABILITY

The receiving circuit and the light receiving circuit of the present invention can reduce the output load of the transimpedance amplifier and thereby achieve a high-speed operation, and can adjust the output with high precision while addressing a wide dynamic range, and therefore, can be utilized in general optical communication apparatuses which need to support signal inputs within a wide dynamic range.

The invention claimed is:

1. A receiving circuit comprising:
a transimpedance amplifier including an inversion amplifier for amplifying an input current, and a feedback resistance connected in parallel between an input and an output of the inversion amplifier, wherein a gain of the transimpedance amplifier is adjusted in accordance with a control signal;
a comparison circuit for comparing an output value of the transimpedance amplifier with a first comparative value set for determining an output level of the transimpedance amplifier, and outputting a result of the comparison; and
a control circuit for holding the comparison result output from the comparison circuit, generating the control signal based on the held comparison result, and transmitting the generated control signal to the transimpedance amplifier,
wherein the control circuit includes:
a plurality of latch circuits for holding the comparison result output from the comparison circuit;
a control signal generating circuit for generating the control signal for adjusting the gain of the transimpedance amplifier based on output results of the plurality of latch circuits, and transmitting the control signal to the transimpedance amplifier; and
a reset signal generating circuit for generating, based on the reset signal, the held-value resetting signal which is transmitted to the plurality of latch circuits to cause the latch circuits to go to a non-operating state, and which is successively caused not to be transmitted to the latch circuits so that the latch circuits are successively caused to go to an operating state in which the comparison result output from the comparison circuit is held, and
the control circuit outputs the control signal so as to adjust the gain of the transimpedance amplifier until the output of the transimpedance amplifier exceeds the first comparative value,
wherein the control signal generating circuit generates the control signal for adjusting the gain of the transimpedance amplifier based on the comparison results output by the plurality of latch circuits, and when the output of the transimpedance amplifier exceeds the first comparative value, transmits a stop signal to the reset signal generating circuit to hold a state at that time, and does not generate a new signal.

2. A receiving circuit comprising:
a transimpedance amplifier including an inversion amplifier for amplifying an input current, and a feedback resistance connected in parallel between an input and an output of the inversion amplifier, wherein a gain of the transimpedance amplifier is adjusted in accordance with a control signal;
a comparison circuit for comparing an output value of the transimpedance amplifier with a first comparative value set for determining an output level of the transimpedance amplifier, and outputting a result of the comparison; and
a control circuit for holding the comparison result output from the comparison circuit, generating the control signal based on the held comparison result, and transmitting the generated control signal to the transimpedance amplifier,
wherein the control circuit includes:
a plurality of latch circuits for holding the comparison result output from the comparison circuit;
a control signal generating circuit for generating the control signal for adjusting the gain of the transimpedance amplifier based on output results of the plurality of latch circuits, and transmitting the control signal to the transimpedance amplifier; and
a reset signal generating circuit for generating, based on the reset signal, the held-value resetting signal which is transmitted to the plurality of latch circuits to cause the latch circuits to go to a non-operating state, and which is successively caused not to be transmitted to the latch circuits so that the latch circuits are successively caused to go to an operating state in which the comparison result output from the comparison circuit is held, and
the control circuit outputs the control signal so as to adjust the gain of the transimpedance amplifier until the output of the transimpedance amplifier exceeds the first comparative value,
wherein the control signal generating circuit generates the control signal for adjusting the gain of the transimpedance amplifier based on the comparison results output by the plurality of latch circuits, and when the output of the transimpedance amplifier exceeds the first comparative value, transmits a stop signal to the plurality of latch circuits to hold a state at that time, and does not perform a new latch operation.

3. A receiving circuit comprising:
a transimpedance amplifier including an inversion amplifier for amplifying an input current, and a feedback resistance connected in parallel between an input and an output of the transimpedance amplifier, wherein a gain of the inversion amplifier is adjusted in accordance with a control signal;
a comparison circuit for comparing an output value of the transimpedance amplifier with a first comparative value set for determining an output level of the transimpedance amplifier, and outputting a result of the comparison; and
a control circuit for holding the comparison result output from the comparison circuit, generating the control signal based on the held comparison result, and transmitting the generated control signal to the transimpedance amplifier, a reference value generating circuit for receiving the output value of the transimpedance amplifier included in the receiving circuit, and generating an intermediate value of the output value; and a differential amplification circuit for generating a differential signal from the output value of the transimpedance amplifier and an output value of the reference value generating circuit, wherein the control circuit includes:

a plurality of latch circuits for holding the comparison result output from the comparison circuit; and a control signal generating circuit for generating the control signal for adjusting the gain of the transimpedance amplifier based on output results of the plurality of latch circuits, and transmitting the control signal to the transimpedance amplifier, each of the latch circuits goes to a non-operating state when receiving a held-value resetting signal, and successively goes to an operating state in which the comparison result output from the comparison circuit is held when the held-value resetting signal is successively disabled, and the control circuit outputs the control signal so as to adjust the gain of the transimpedance amplifier until the output of the transimpedance amplifier exceeds the first comparative value, wherein, when the reset signal is input to the reference value generating circuit, the intermediate value is initialized.

4. The receiving circuit of claim 3, wherein the reference value generating circuit comprises:

two or more intermediate value generating circuits connected in parallel; and a switch inserted in series between each of the intermediate value generating circuits and the differential amplification circuit, for selectively connecting the intermediate value generating circuit and the differential amplification circuit, wherein, when the switch connected in series receives a signal for switching ON the switch, an intermediate value reset signal for releasing the reset of the intermediate value is input to the intermediate value generating circuit, and when the switch connected in series receives a signal for switching OFF the switch, the intermediate value reset signal for resetting the intermediate value generating circuit is input.

5. The receiving circuit of claim 4, wherein the control circuit comprises:

a plurality of latch circuits for holding the comparison result output from the comparison circuit, wherein the control circuit transmits a held-value resetting signal to the plurality of latch circuits to cause each of the latch circuits to go to a non-operating state, and successively disables the held-value resetting signal of the latch circuits to cause the latch circuits to go to an operating state in which the comparison result output from the comparison circuit is successively held, and based on output values of the plurality of latch circuits, generates the intermediate value reset signal to be input to the intermediate value generating circuit, and a signal for switching ON or OFF the switch for selectively connecting the intermediate value generating circuit to the differential amplification circuit.

6. The receiving circuit of claim 5, wherein the control circuit successively disables the held-value resetting signal transmitted to each of the latch circuits, outputs the control signal for controlling the gain of the transimpedance amplifier, and generates the intermediate value reset signal and the signal for switching ON or OFF the switch to switch and select the intermediate value, based on the reset signal and the output values of the plurality of latch circuits, until the output value of the transimpedance amplifier exceeds the first comparative value, and when the output value of the transimpedance amplifier exceeds the first comparative value, does not newly disable the held-value resetting signal.

7. The receiving circuit of claim 4, wherein the control circuit comprises:

a shift register circuit for successively holding the comparison result output from the comparison circuit, wherein the control circuit transmits the reset signal to the shift register circuit to cause the shift register circuit to go to a non-operating state, and disables the reset signal of the shift register circuit to cause the shift register circuit to go to an operating state in which the comparison result output from the comparison circuit is successively held, and based on the reset signal input to the control circuit and an output value of the register circuit, outputs the control signal for adjusting the gain of the transimpedance amplifier, and generates the intermediate value reset signal to be input to the intermediate value generating circuit and a signal for switching ON or OFF the switch for selectively connecting the intermediate value generating circuit to the differential amplification circuit.

8. The receiving circuit of claim 4, wherein the two or more intermediate value generating circuits are alternately used.

\* \* \* \* \*